(12) United States Patent
Lin et al.

(10) Patent No.: US 11,239,103 B2
(45) Date of Patent: *Feb. 1, 2022

(54) PACKAGE-ON-PACKAGE STRUCTURE

(71) Applicant: Taiwan Semiconductor Manufacturing Company, Ltd., Hsinchu (TW)

(72) Inventors: Chih-Wei Lin, Zhubei (TW); Hui-Min Huang, Taoyuan (TW); Ai-Tee Ang, Hsinchu (TW); Yu-Peng Tsai, Hsinchu (TW); Ming-Da Cheng, Jhubei (TW); Chung-Shi Liu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/846,921

(22) Filed: Apr. 13, 2020

(65) Prior Publication Data

US 2020/0243370 A1 Jul. 30, 2020

Related U.S. Application Data

(60) Continuation of application No. 15/705,977, filed on Sep. 15, 2017, now Pat. No. 10,622,240, which is a
(Continued)

(51) Int. Cl.
*H01L 21/683* (2006.01)
*H01L 23/498* (2006.01)
(Continued)

(52) U.S. Cl.
CPC ........ *H01L 21/6835* (2013.01); *H01L 21/563* (2013.01); *H01L 23/3128* (2013.01);
(Continued)

(58) Field of Classification Search
CPC . H01L 21/6835; H01L 21/563; H01L 25/105; H01L 23/3128; H01L 23/49822;
(Continued)

(56) References Cited

U.S. PATENT DOCUMENTS 6,787,917 B2 9/2004 Lee et al.
8,900,994 B2 12/2014 Yu et al.
(Continued)

FOREIGN PATENT DOCUMENTS

| CN | 1499630 A | 5/2004 |
|---|---|---|
| CN | 102820257 A | 12/2012 |
| CN | 102931164 A | 2/2013 |

*Primary Examiner* — Patricia D Reddington
(74) *Attorney, Agent, or Firm* — Slater Matsil, LLP

(57) ABSTRACT

A method comprises forming a plurality of interconnect structures including a dielectric layer, a metal line and a redistribution line over a carrier, attaching a semiconductor die on a first side of the plurality of interconnect structures, forming an underfill layer between the semiconductor die and the plurality of interconnect structures, mounting a top package on the first side the plurality of interconnect structures, wherein the top package comprises a plurality of conductive bumps, forming an encapsulation layer over the first side of the plurality of interconnect structures, wherein the top package is embedded in the encapsulation layer, detaching the carrier from the plurality of interconnect structures and mounting a plurality of bumps on a second side of the plurality of interconnect structures.

20 Claims, 24 Drawing Sheets

Related U.S. Application Data division of application No. 13/894,005, filed on May 14, 2013, now Pat. No. 9,768,048.

(60) Provisional application No. 61/793,385, filed on Mar. 15, 2013.

(51) Int. Cl.

| | | |
|---|---|---|
| *H01L 23/00* | (2006.01) | |
| *H01L 25/00* | (2006.01) | |
| *H01L 23/31* | (2006.01) | |
| *H01L 25/10* | (2006.01) | |
| *H01L 21/56* | (2006.01) | |

(52) U.S. Cl.
CPC .. *H01L 23/49811* (2013.01); *H01L 23/49822* (2013.01); *H01L 23/49827* (2013.01); *H01L 24/97* (2013.01); *H01L 25/105* (2013.01); *H01L 25/50* (2013.01); *H01L 21/561* (2013.01); *H01L 24/16* (2013.01); *H01L 24/48* (2013.01); *H01L 24/81* (2013.01); *H01L 24/83* (2013.01); *H01L 2221/68345* (2013.01); *H01L 2224/11* (2013.01); *H01L 2224/131* (2013.01); *H01L 2224/13147* (2013.01); *H01L 2224/16225* (2013.01); *H01L 2224/16237* (2013.01); *H01L 2224/19* (2013.01); *H01L 2224/26175* (2013.01); *H01L 2224/2919* (2013.01); *H01L 2224/32145* (2013.01); *H01L 2224/32225* (2013.01); *H01L 2224/45015* (2013.01); *H01L 2224/45099* (2013.01); *H01L 2224/48227* (2013.01); *H01L 2224/73204* (2013.01); *H01L 2224/73265* (2013.01); *H01L 2224/81005* (2013.01); *H01L 2224/81193* (2013.01); *H01L 2224/81815* (2013.01); *H01L 2224/83* (2013.01); *H01L 2224/83104* (2013.01); *H01L 2224/97* (2013.01); *H01L 2225/0651* (2013.01); *H01L 2225/1023* (2013.01); *H01L 2225/1058* (2013.01); *H01L 2924/00014* (2013.01); *H01L 2924/12042* (2013.01); *H01L 2924/15311* (2013.01); *H01L 2924/15331* (2013.01); *H01L 2924/181* (2013.01); *H01L 2924/351* (2013.01)

(58) Field of Classification Search
CPC ......... H01L 23/49827; H01L 23/49811; H01L 24/97; H01L 25/50; H01L 2224/45015; H01L 2224/45099; H01L 2224/83; H01L 2924/00014; H01L 2224/16225; H01L 2224/73265; H01L 2924/12042; H01L 2924/181; H01L 2924/351; H01L 2225/0651; H01L 2225/1023; H01L 2225/1058; H01L 2924/15311; H01L 2924/15331; H01L 2224/131; H01L 2224/13147; H01L 2224/16237; H01L 2224/2919; H01L 2224/32145; H01L 2224/32225; H01L 2224/48227; H01L 21/561; H01L 24/16; H01L 24/48; H01L 24/81; H01L 24/83; H01L 2221/68345; H01L 2224/26175; H01L 2224/73204; H01L 2224/81005; H01L 2224/81193; H01L 2224/81815; H01L 2224/97; H01L 2224/83104; H01L 2224/11; H01L 2224/19

See application file for complete search history.

(56) References Cited

U.S. PATENT DOCUMENTS

| 9,768,048 | B2 | 9/2017 | Lin et al. | |
|---|---|---|---|---|
| 10,622,240 | B2* | 4/2020 | Lin | ............ H01L 25/50 |
| 2004/0074865 | A1 | 4/2004 | Ho et al. | |
| 2004/0124518 | A1 | 7/2004 | Karnezos | |
| 2006/0244117 | A1 | 11/2006 | Karnezos et al. | |
| 2008/0182363 | A1 | 7/2008 | Amrine et al. | |
| 2009/0011539 | A1 | 1/2009 | Jeng et al. | |
| 2009/0236752 | A1* | 9/2009 | Lee | ............ H01L 24/97 |
| | | | | 257/777 |
| 2010/0117229 | A1 | 5/2010 | Datta et al. | |
| 2010/0252937 | A1 | 10/2010 | Uchiyama | |
| 2011/0159282 | A1 | 6/2011 | Kim et al. | |
| 2011/0263076 | A1 | 10/2011 | Yoshimura et al. | |
| 2011/0298137 | A1 | 12/2011 | Pagaila et al. | |
| 2011/0316140 | A1 | 12/2011 | Nalla et al. | |
| 2012/0104623 | A1 | 5/2012 | Pagaila et al. | |
| 2012/0159118 | A1 | 6/2012 | Wong et al. | |
| 2013/0105991 | A1 | 5/2013 | Gan et al. | |
| 2013/0127054 | A1* | 5/2013 | Muthukumar | ...... H01L 23/3121 |
| | | | | 257/738 |
| 2013/0180772 | A1* | 7/2013 | Inoue | ............ H05K 3/4007 |
| | | | | 174/263 |

* cited by examiner

PACKAGE-ON-PACKAGE STRUCTURE

CROSS REFERENCE TO RELATED APPLICATIONS

This application is a continuation of U.S. application Ser. No. 15/705,977 filed on Sep. 15, 2017, entitled "Package-on-Package Structure," which is a divisional of U.S. application Ser. No. 13/894,005, now U.S. Pat. No. 9,768,048, filed on May 14, 2013, entitled "Package-on-Package Structure," which is related to, and claims priority to U.S. Provisional Application No. 61/793,385, entitled "Package-on-Package Structure," filed Mar. 15, 2013, which are herein incorporated in their entirety by reference.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the sub-20 nm node). As the demand for miniaturization, higher speed and greater bandwidth, as well as lower power consumption and latency has grown recently, there has grown a need for smaller and more creative packaging techniques of semiconductor dies.

As semiconductor technologies further advance, package-on-package semiconductor devices have emerged as an effective alternative to further reduce the physical size of a semiconductor device. In a package on package semiconductor device, active circuits such as logic, memory, processor circuits and the like are fabricated on different wafers and packages. Two or more packages are installed on top of one another, i.e. stacked, with a standard interface to route signals between them. Much higher density can be achieved by employing package on package semiconductor devices. Furthermore, package on package semiconductor devices can achieve smaller form factors, cost-effectiveness, increased performance and lower power consumption.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, namely a package-on-package semiconductor device with an underfill layer formed between the top package and the bottom package. The embodiments of the disclosure may also be applied, however, to a variety of semiconductor devices. Hereinafter, various embodiments will be explained in detail with reference to the accompanying drawings.

Figure 1:
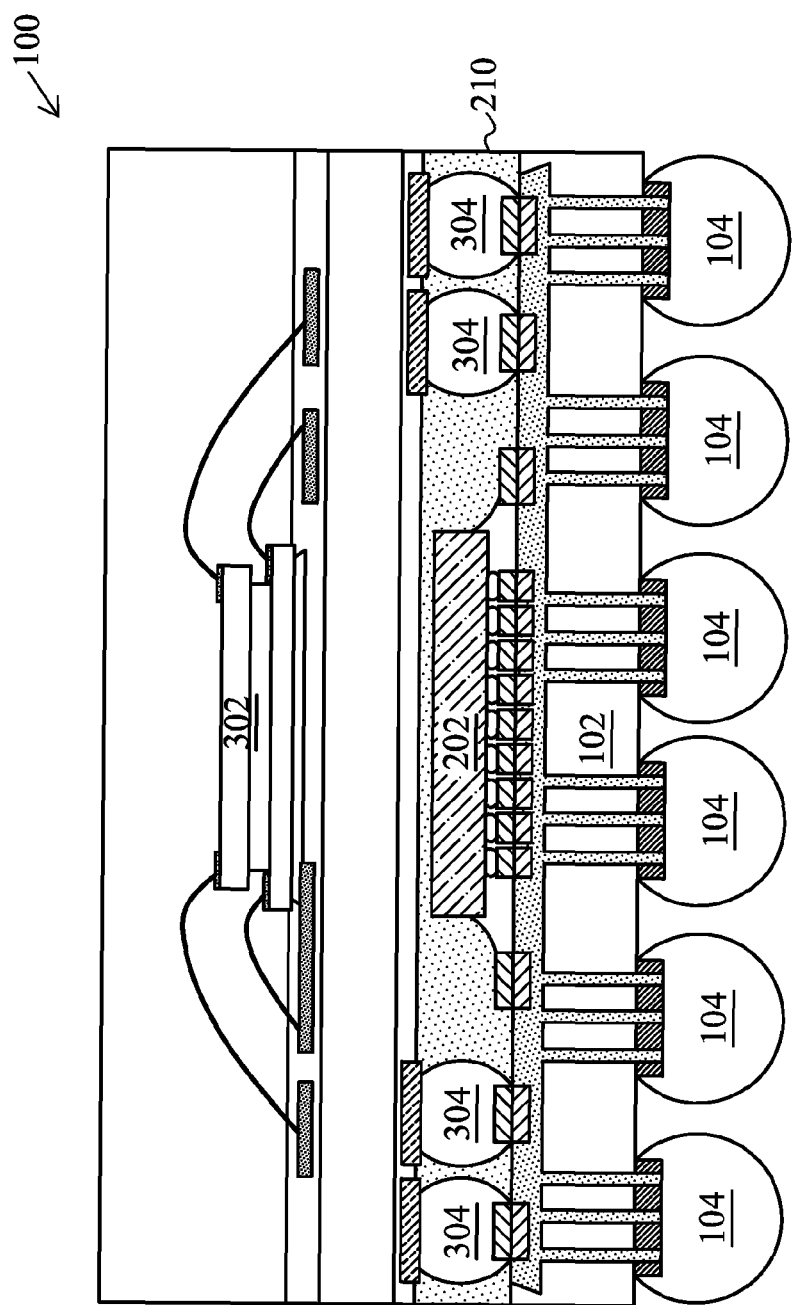
FIG. 1 illustrates a cross sectional view of a package-on-package semiconductor device in accordance with various embodiments of the present disclosure.

FIG. 1 illustrates a cross sectional view of a package-on-package semiconductor device in accordance with various embodiments of the present disclosure. The package-on-package semiconductor device 100 may include a bottom package 102 and a top package 302. In particular, the top package 302 is stacked on top of the bottom package 102. The detailed structures of the bottom package 102 and the top package 302 will be described in detail with respect to FIG. 3 and FIG. 7 respectively.

As shown in FIG. 1, the top package 302 and the bottom package 102 are bonded together through a joint structure formed by conductive bumps 304. The joint structure may be generated by a reflow process.

A semiconductor die 202 is bonded on a first side of the bottom package 102. There may be a plurality of bumps coupled between the semiconductor die 202 and the bottom package 102. The detailed bonding process as well as the structure of the semiconductor die 202 will be described below with respect to FIG. 5.

A plurality of bumps 104 are formed on a second side of the bottom package 102. There may be a plurality of under bump metallization (UBM) structures formed underneath the bumps 104. The detailed formation processes of the bumps 104 and the UBM structures will be described below with respect to FIG. 12.

As shown in FIG. 1, an underfill layer 210 is formed between the top package 302 and the bottom package 102. The semiconductor die 202 as well as conductive bumps 304 are embedded in the underfill layer 210. It should be noted that the number of conductive bumps (e.g., conductive bumps 304) shown in FIG. 1 is merely an example. A person skilled in the art will recognize that the package-on-package semiconductor device 100 may accommodate any number of conductive bumps.

It should further be noted that the underfill layer 210 shown in FIG. 1 is merely an example. One person skilled in the art will recognize there may be many variations, modifications and alternatives. For example, the underfill layer 210 may be formed of a variety of suitable materials.

Figure 2:
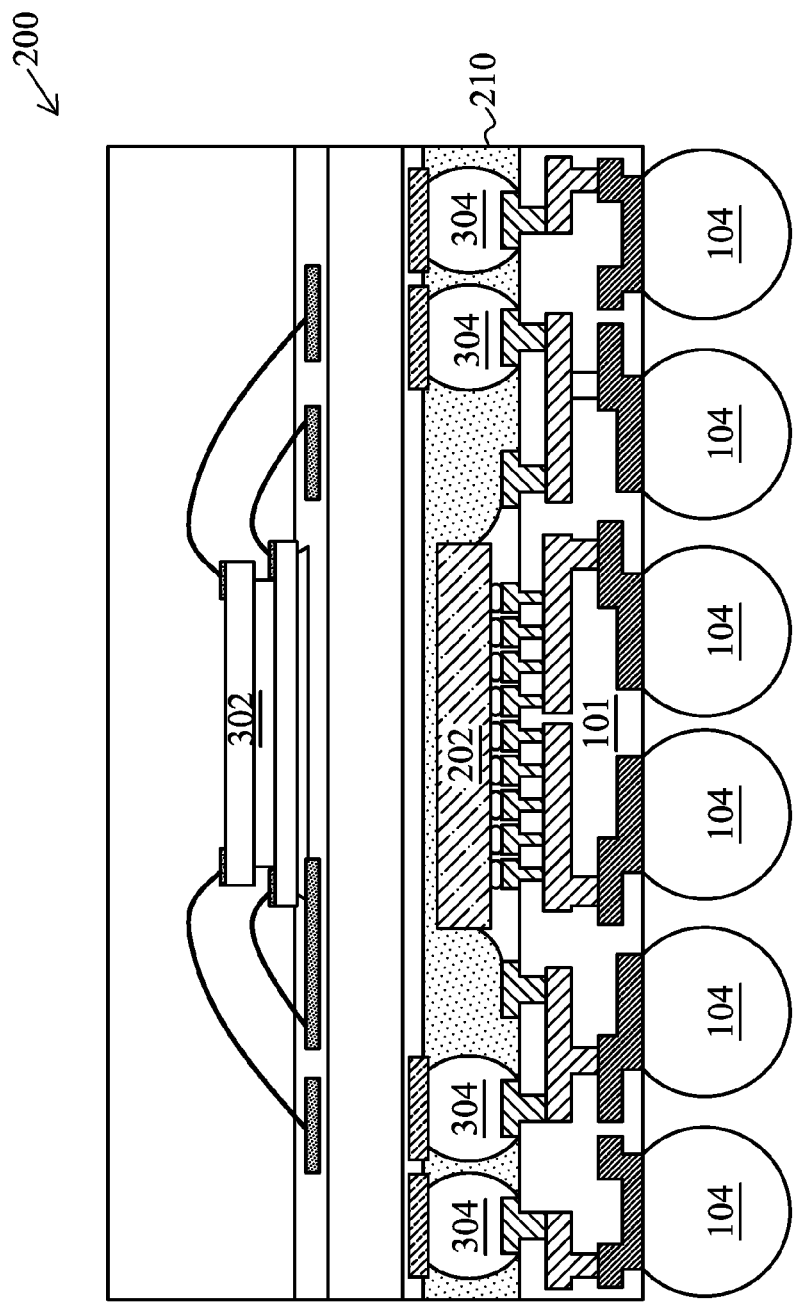
FIG. 2 illustrates a cross sectional view of another package-on-package semiconductor device in accordance with various embodiments of the present disclosure.

FIG. 2 illustrates a cross sectional view of another package-on-package semiconductor device in accordance with various embodiments of the present disclosure. The package-on-package semiconductor device 200 is similar to the package-on-package semiconductor device 100 shown in FIG. 1 except that the bottom package 101 is formed by a plurality of interconnect structures. In some embodiments, the interconnect structures may comprise one inter-layer dielectric (ILD) layer, one inter-metal dielectric (IMD) layer, a metal line and a redistribution layer. The detailed formation process of the bottom package 101 will be described below with respect to FIGS. 14-24.

FIGS. 3-13 illustrate intermediate steps of fabricating the package-on-package semiconductor device shown in FIG. 1 in accordance with various embodiments of the present disclosure. It should be noted that the fabrication steps as well as the package-on-package structure shown in FIGS. 3-13 are merely an example. A person skilled in the art will recognize there may be many alternatives, variations and modifications.

Figure 3:
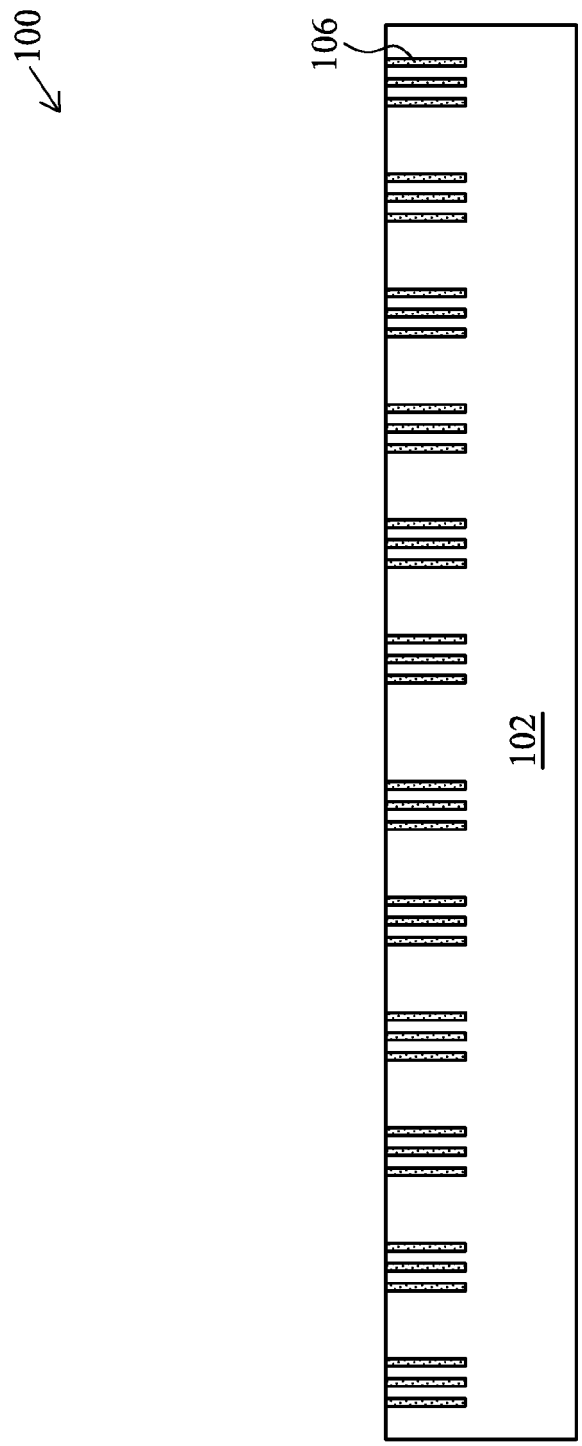
FIG. 3 illustrates a cross sectional view of a bottom package in accordance with various embodiments of the present disclosure.

FIG. 3 illustrates a cross sectional view of a bottom package in accordance with various embodiments of the present disclosure. The bottom package 102 may be a silicon substrate. Alternatively, the bottom package 102 may be other suitable structures such as a glass interposer, a silicon interposer and/or the like. In some embodiments, the bottom package 102 may be a standard wafer having a thickness more than 100 um. In accordance with alternative embodiments, the bottom package 102 may be of a thickness of about 770 um.

In some embodiments, the bottom package 102 may be formed of silicon, although it may also be formed of other group III, group IV, and/or group V elements, such as silicon, germanium, gallium, arsenic, and combinations thereof. The bottom package 102 may comprise a bulk substrate or a silicon-on-insulator (SOI) substrate.

According to alternative embodiments, the bottom package 102 may be made of other suitable materials such as ceramic materials, organic materials, any combinations thereof and/or the like.

The bottom package 102 may comprise a plurality of integrated circuits (not shown), each of which may comprise various layers such as active circuit layers, substrate layers, ILD layers and IMD layers (not shown respectively). The bottom package 102 may further comprise a plurality of through vias. In some embodiments, the through vias are through-substrate vias (TSVs) or through-silicon vias (TSVs), such as TSVs 106. The TSV 106 may be filled with a conductive material such as copper, tungsten and/or the like. The active circuit layers (not shown) of the bottom package 102 may be coupled to external circuits (not shown) formed over the bottom package 102 through the plurality of TSVs (e.g., TSV 106).

Figure 4:
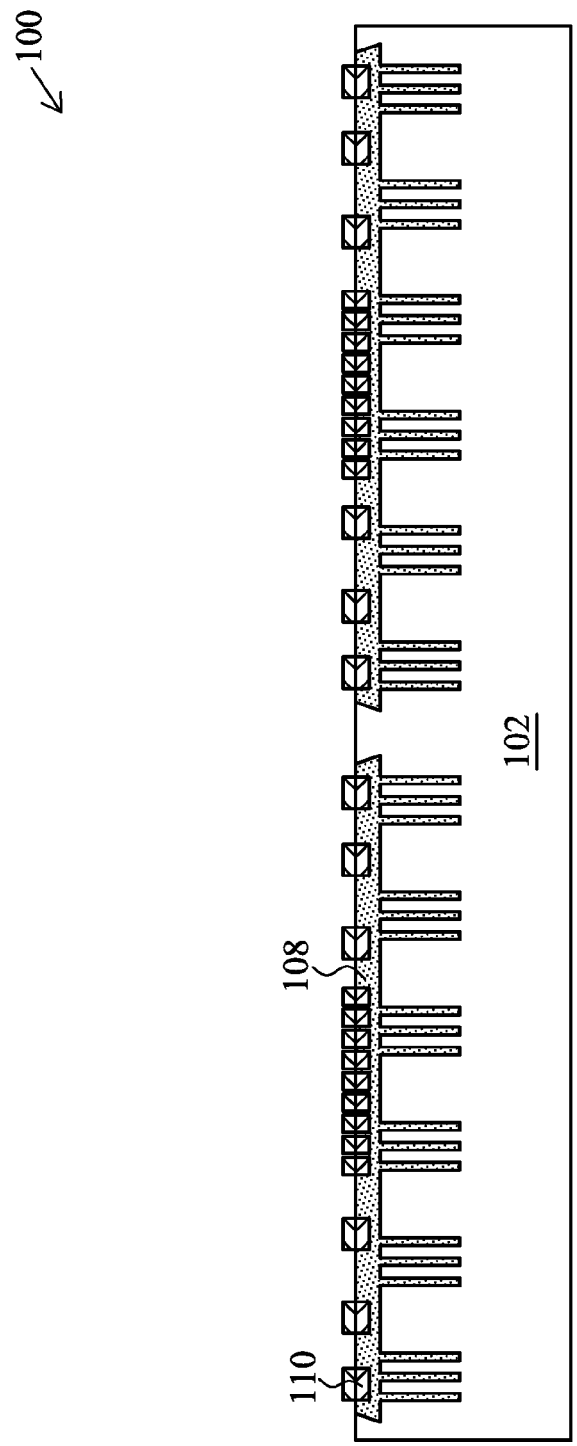
FIG. 4 illustrates a cross sectional view of the bottom package shown in FIG. 3 after a dielectric layer and a redistribution layer are formed over the bottom package in accordance with various embodiments of the present disclosure.

FIG. 4 illustrates a cross sectional view of the bottom package shown in FIG. 3 after a dielectric layer and a redistribution layer are formed over the bottom package in accordance with various embodiments of the present disclosure. As shown in FIG. 4, the dielectric layer and the redistribution layer are formed on one side of the bottom package 102. Throughout the description, this side of the bottom package 102 is alternatively referred to as a front side of the bottom package 102.

A dielectric layer 108 is formed over the bottom package 102. The dielectric layer 108 may be alternatively referred to as an ILD layer 108 hereinafter. In some embodiments, the ILD layer 108 is formed of a photo-sensitive material such as polybenzoxazole (PBO), polyimide, benzocyclobutene (BCB), any combinations thereof and/or the like, which may be easily patterned using a lithography mask.

In alternative embodiments, the ILD layer 108 may be formed of a nitride such as silicon nitride, an oxide such as silicon oxide, phosphosilicate glass (PSG), borosilicate glass (BSG), boron-doped phosphosilicate glass (BPSG), any combinations thereof and/or the like. The ILD layer 108 may be formed by suitable fabrication techniques such as such as spinning, chemical vapor deposition (CVD), and plasma enhanced CVD (PECVD) and/or the like.

As shown in FIG. 4, a first redistribution layer 110 is formed over a first side of the bottom package 102. More particularly, the first redistribution layer 110 provides a conductive path between TSVs (e.g., TSV 106) and a plurality of interconnect structures (e.g., the metal bumps)

subsequently formed over the bottom package 102. The first redistribution layer 110 may be formed of metal materials such as aluminum, aluminum alloys, copper or copper alloys and the like.

Figure 5:
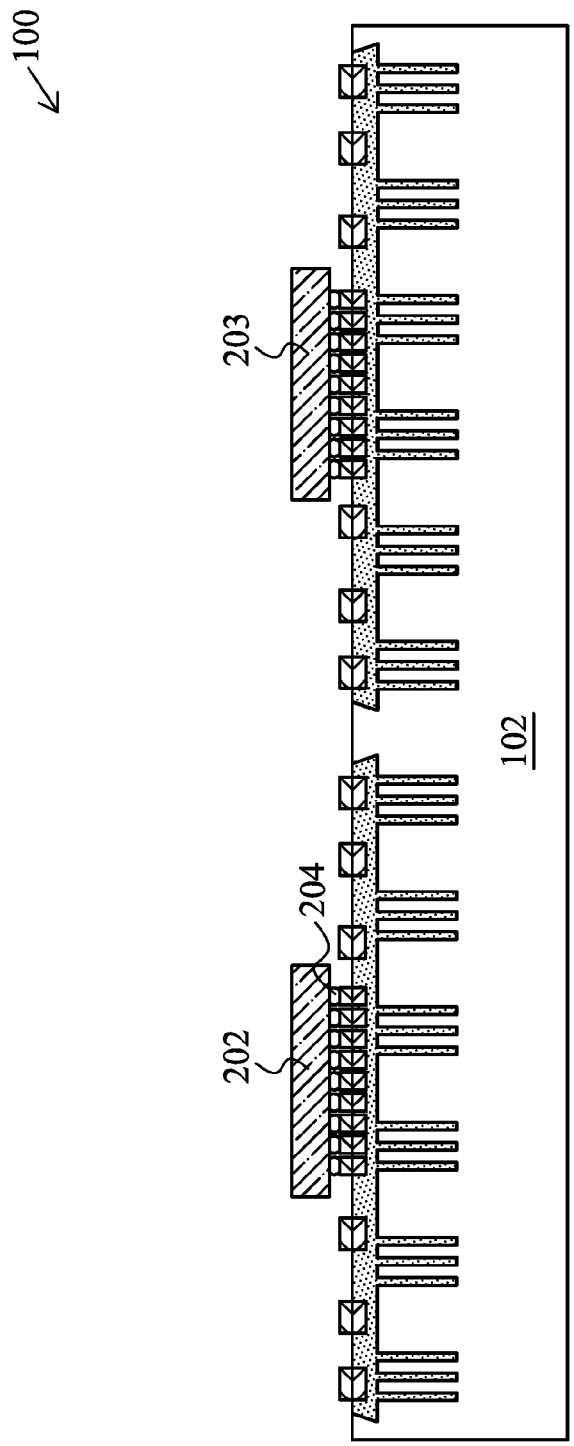
FIG. 5 illustrates a cross sectional view of the semiconductor device shown in FIG. 4 after a plurality of semiconductor dies are mounted on the bottom package in accordance with various embodiments of the present disclosure.

FIG. 5 illustrates a cross sectional view of the semiconductor device shown in FIG. 4 after a plurality of semiconductor dies are mounted on the bottom package in accordance with various embodiments of the present disclosure. The semiconductor dies 202 and 203 are picked and placed on top of the bottom package 102. After a reflow process, the semiconductor dies 202 and 203 are bonded on the bottom package 102 through the bumps 204, which are coupled between the bottom package 102 and the semiconductor dies 202 and 203 as shown in FIG. 5.

In some embodiments, the bonding process may be a suitable fabrication process such as a bump on trace (BOT) process and/or the like. The detailed processes of bonding semiconductor dies on a bottom package are well known in the art, and hence are not discussed herein. It should be noted that while FIG. 5 illustrates two semiconductor dies bonded on the bottom package 102, the bottom package 102 may accommodate any number of semiconductor dies.

In order to give a basic insight of the inventive aspects of various embodiments, the semiconductor dies 202 and 203 are drawn without details. However, it should be noted that the semiconductor dies 202 and 203 may comprise basic semiconductor layers such as active circuit layers, substrate layers, ILD layers and IMD layers (not shown respectively).

The semiconductor dies 202 and 203 may comprise a substrate (not shown). The substrate may be a silicon substrate. Alternatively, the substrate may be a silicon-on-insulator substrate. The substrate may further comprise a variety of electrical circuits (not shown). The electrical circuits formed on the substrate may be any type of circuitry suitable for a variety of applications such as logic circuits.

In some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. One of ordinary skill in the art will appreciate that the above examples are provided for illustrative purposes only to further explain applications of the present disclosure and are not meant to limit the present disclosure in any manner.

An isolation layer (not shown) is formed on the substrate. The isolation layer may be formed, for example, of a dielectric material, such as silicon oxide. The isolation layer may be formed by any suitable method known in the art, such as spinning, CVD, PECVD and the like. It should also be noted that one skilled in the art will recognize that the isolation layer may further comprise a plurality of dielectric layers.

A redistribution layer (not shown) may be formed on the isolation layer. The active circuit layer (not shown) of the semiconductor dies 202 and 203 may be bridged by the redistribution layer so that the active circuit layer of the semiconductor dies (e.g., semiconductor die 202) can be coupled to the input and output terminals (e.g., bumps 204) of the semiconductor dies (e.g., semiconductor die 202). A plurality of UBM structures (not shown) may be formed on the redistribution layer. The UBM structures may help to prevent diffusion between the bumps (e.g., bumps 204) and the integrated circuits of the semiconductor dies 202 and 203, while providing a low resistance electrical connection.

The bumps (e.g., bumps 204) provide an effective way to connect the semiconductor dies 202 and 203 with the bottom package 102. The bumps are I/O terminals of the semiconductor die 202. In some embodiments, the bumps (e.g., bumps 204) may be a plurality of solder balls, micro bumps, copper pillars and/or the like. Alternatively, the bumps (e.g., bumps 204) may be a plurality of ball grid array (BGA) balls.

Figure 6:
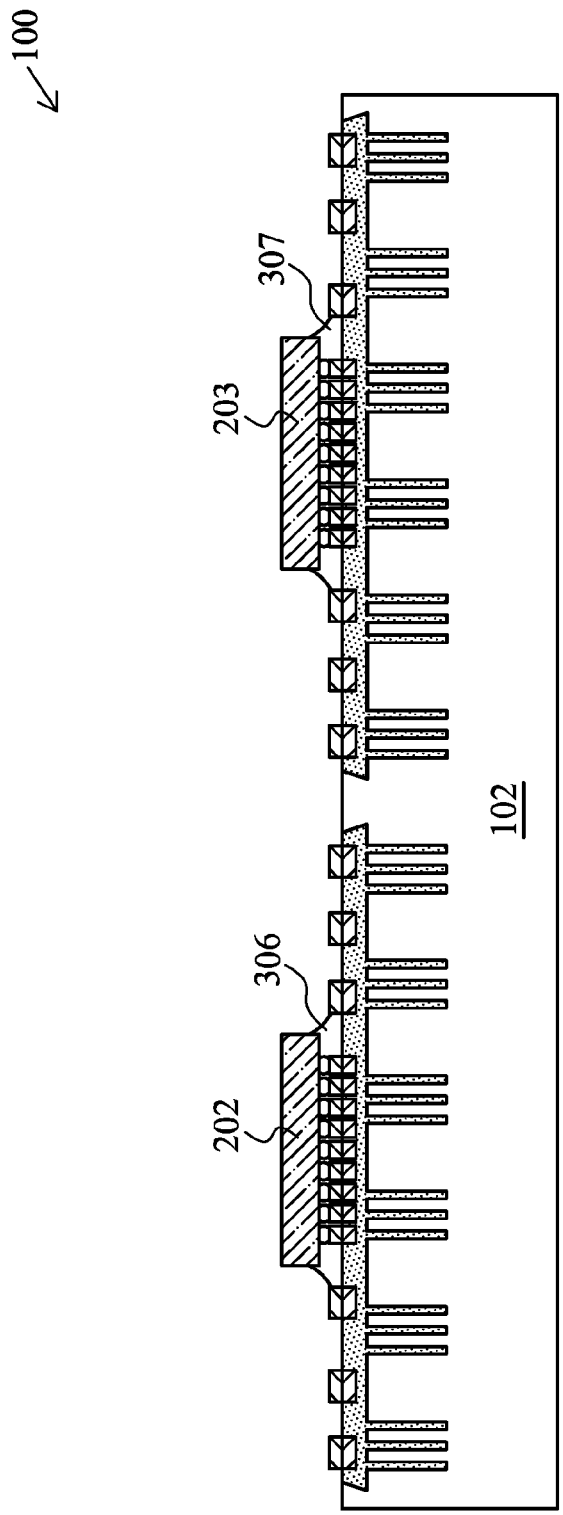
FIG. 6 illustrates a cross sectional view of the semiconductor device shown in FIG. 5 after an underfill layer is formed between the semiconductor dies and the bottom package in accordance with various embodiments of the present disclosure.

FIG. 6 illustrates a cross sectional view of the semiconductor device shown in FIG. 5 after an underfill layer is formed between the semiconductor dies and the bottom package in accordance with various embodiments of the present disclosure. As shown in FIG. 6, a first underfill material layer 306 is formed between the first semiconductor die 202 and the bottom package 102. Likewise, a second underfill material layer 307 is formed between the second semiconductor die 203 and the bottom package 102.

In some embodiments, the underfill material layers 306 and 307 may be formed of an epoxy, which is dispensed at the gaps between the bottom package 102 and the semiconductor dies 202 and 203 and to form the underfill layers 306 and 307. The epoxy may be applied in a liquid form, and may harden after a curing process. In alternative embodiments, the underfill layers 306 and 307 may be formed of curable materials such as polymer based materials, resin based materials, polyimide, epoxy and any combinations of thereof. The underfill layers 306 and 307 may be alternatively referred to as the molding compound layers 306 and 307 respectively throughout the description.

The molding compound layers 306 and 307 can be formed by any suitable dispense techniques. For example, the molding compound layers 306 and 307 may be formed by a spin-on coating process, dry film lamination process and/or the like.

An advantageous feature of having the molding compound layers 306 and 307 is that the underfill material helps to prevent the bumps 304 from cracking. In addition, the underfill material may help to reduce the mechanical and thermal stresses on the semiconductor dies 202 and 203 during the subsequent fabrication processes.

Figure 7:
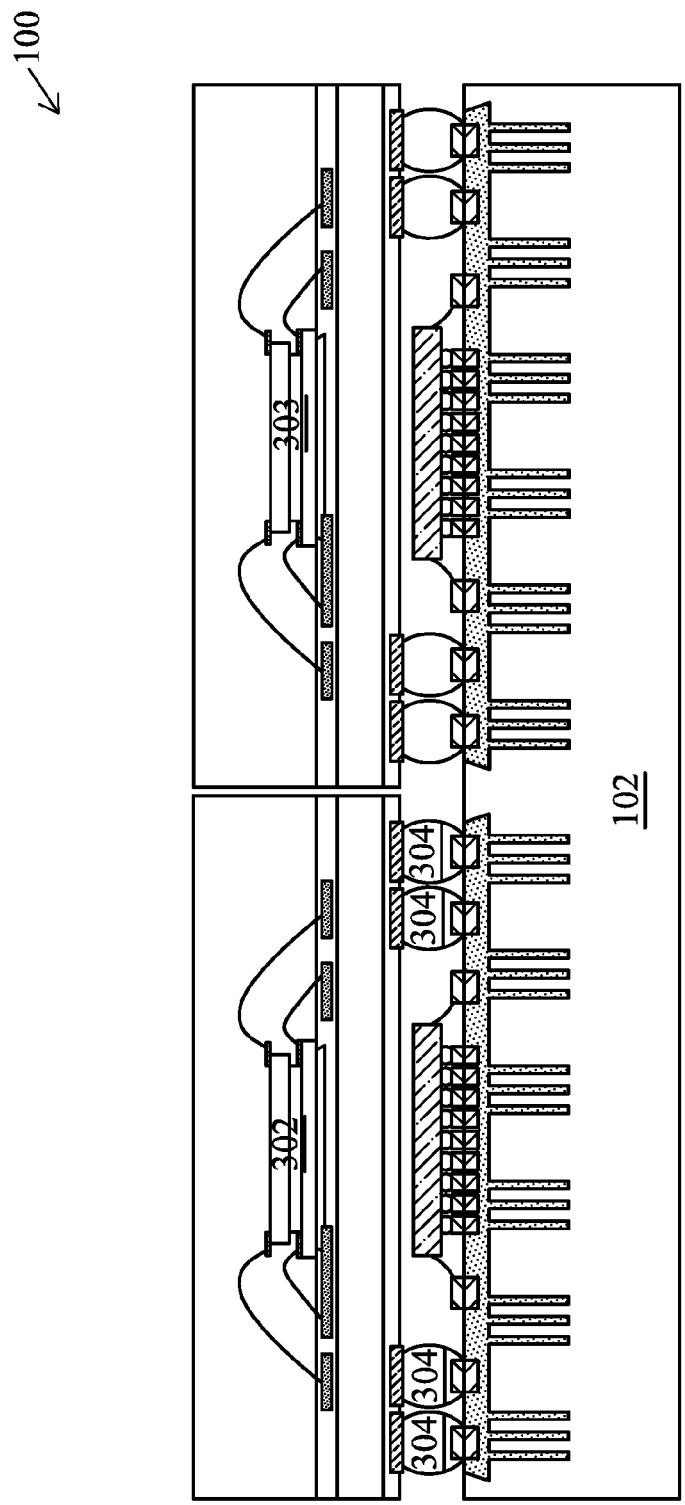
FIG. 7 illustrates a cross sectional view of the semiconductor device shown in FIG. 6 before a plurality of top packages are mounted on the bottom package in accordance with various embodiments of the present disclosure.

FIG. 7 illustrates a cross sectional view of the semiconductor device shown in FIG. 6 before a plurality of top packages are mounted on the bottom package in accordance with various embodiments of the present disclosure. The top packages 302 and 303 may be of a same structure as shown in FIG. 7.

The top packages (e.g., top package 302) may comprise a plurality of stacked dies, which may be wire bonded to the input and output terminals of the top package. The stacked dies of the top packages (e.g., top package 302) may comprise memory dies, logic dies, processor dies and/or the like. It should be noted while FIG. 7 illustrates two stacked dies in the top packages 302 (e.g., top package 302), this is merely an example. Likewise, the use of wire bonding is merely illustrative and other approaches for electrically connecting the stacked dies are within the contemplated scope of the present disclosure.

The top packages 302 and 303 may be bonded on the bottom package 102 through a reflow process. The bonding process comprises placing the metal balls (e.g., conductive bumps 304) of the top packages 302 and 303 against the respective solder pads on top of the front side of the bottom package 102. A reflow process is then performed to melt solder pads, thereby forming a joint structure between the top packages and the bottom package 102 and electrically connecting the solder pads to the metal balls.

Figure 8:
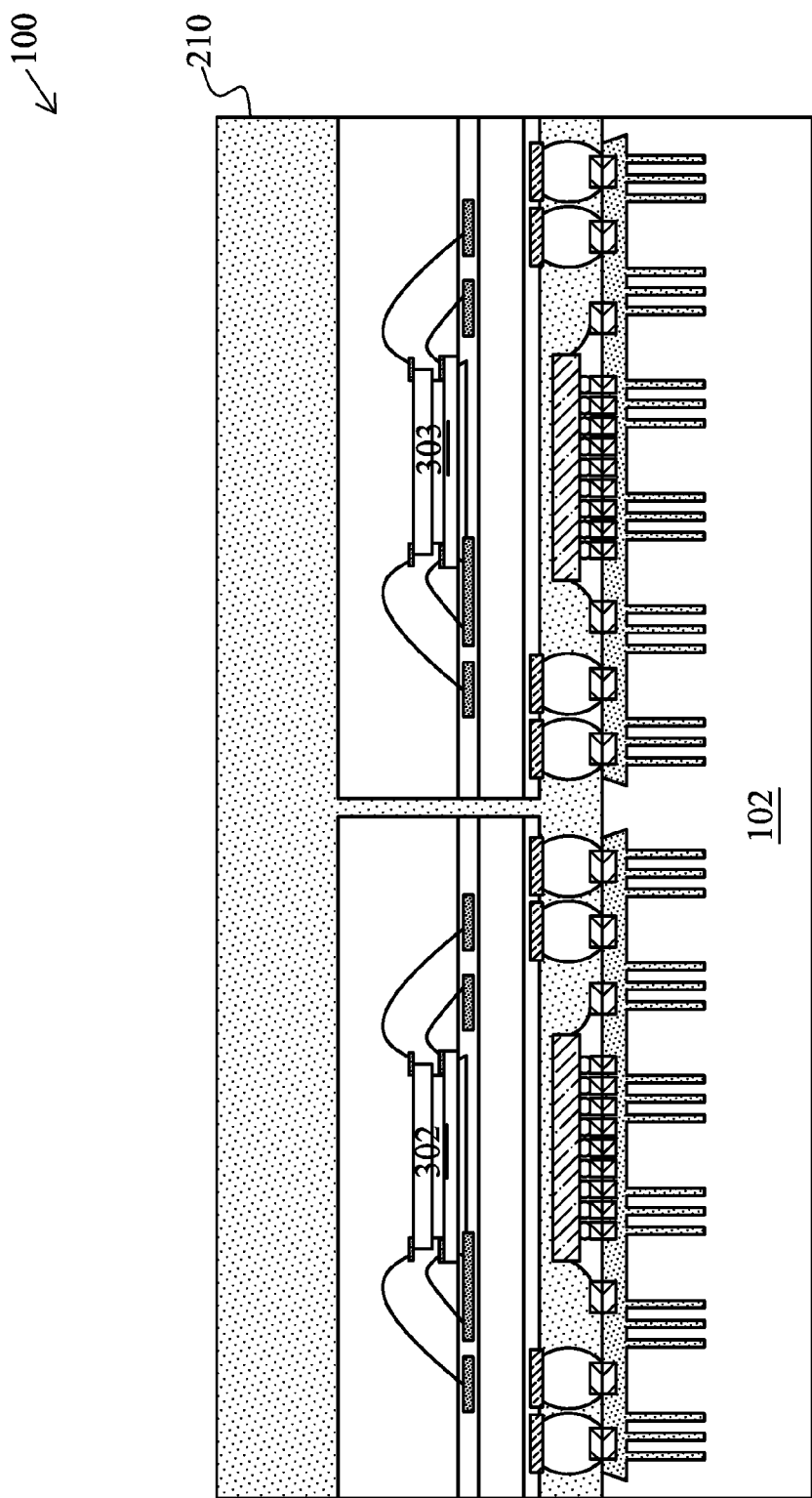
FIG. 8 illustrates a cross sectional view of the semiconductor device shown in FIG. 7 after an encapsulation layer is formed over the wafer in accordance with various embodiments of the present disclosure.

FIG. 8 illustrates a cross sectional view of the semiconductor device shown in FIG. 7 after an encapsulation layer is formed over the wafer in accordance with various embodiments of the present disclosure. The encapsulation layer 210 is formed over the bottom package 102 as shown in FIG. 8. In accordance with some embodiments, the encapsulation layer 210 may be a molding compound layer formed of suitable underfill materials. Throughout the description, the encapsulation layer 210 may be alternatively referred to as an underfill layer 210.

The underfill material layer 210 may fill the gaps between two top packages as well as the gaps between the top packages and the front side of the bottom package 102. In some embodiments, the underfill material layer 210 may be formed of an epoxy, which is dispensed at the gaps between two top packages 302 and 303. The epoxy may be applied in a liquid form, and may harden after a curing process.

In alternative embodiments, the underfill material layer 210 may be formed of curable materials such as polymer based materials, resin based materials, polyimide, epoxy and any combinations of thereof. The underfill material layer 210 can be formed by any suitable dispense techniques.

Figure 9:
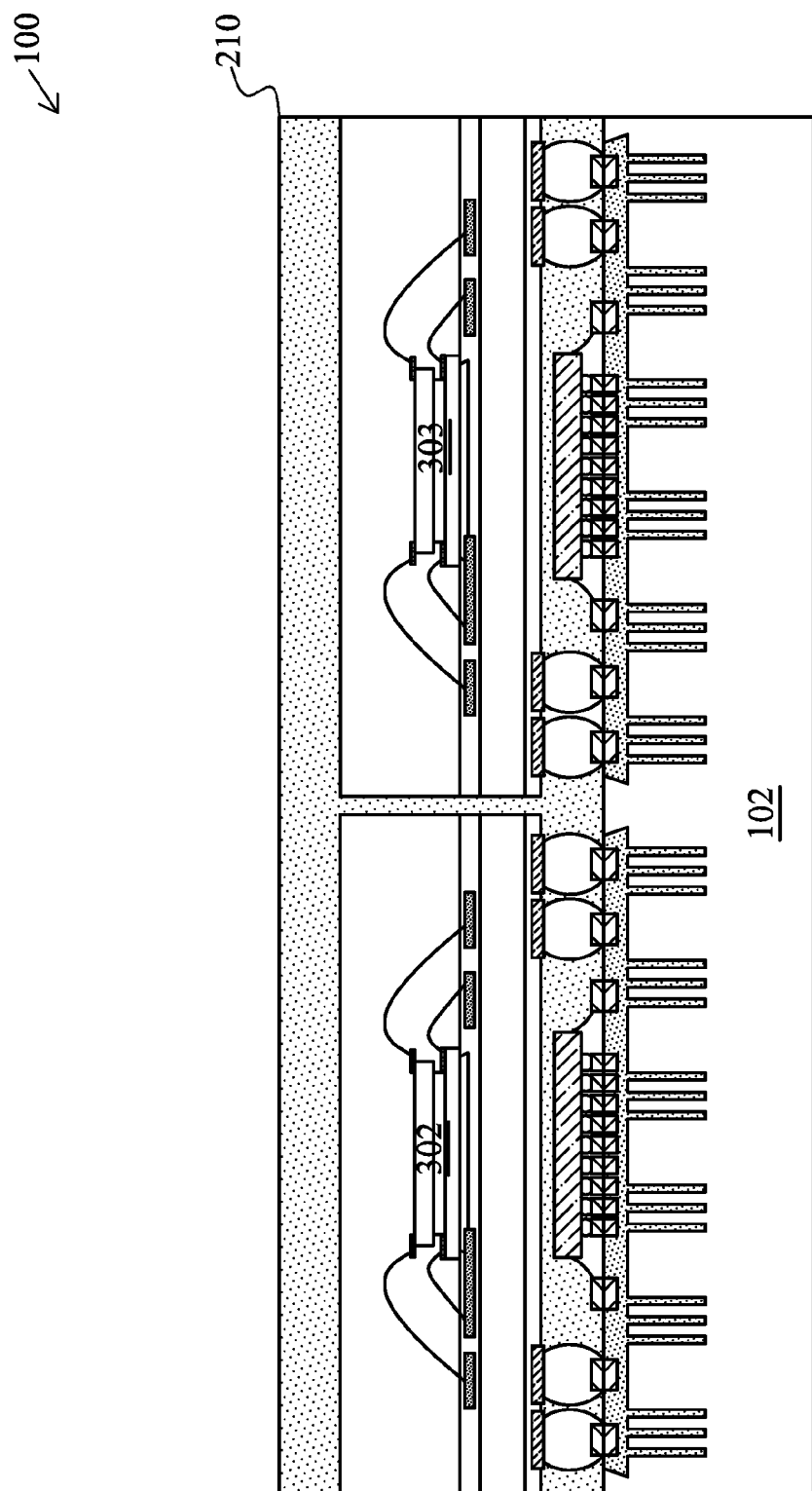
FIG. 9 illustrates a cross sectional view of the semiconductor device shown in FIG. 8 after a polishing process is applied to the exposed side of the encapsulation layer in accordance with various embodiments of the present disclosure.

FIG. 9 illustrates a cross sectional view of the semiconductor device shown in FIG. 8 after a polishing process is applied to the exposed side of the encapsulation layer in accordance with various embodiments of the present disclosure. The top surface of the encapsulation layer may be rough. Such a rough top surface may cause a reliability issue for the subsequent fabrication steps. The roughness of the exposed encapsulation layer may be reduced by using a planarization process such as a chemical mechanical polish (CMP) process and/or the like.

Figure 10:
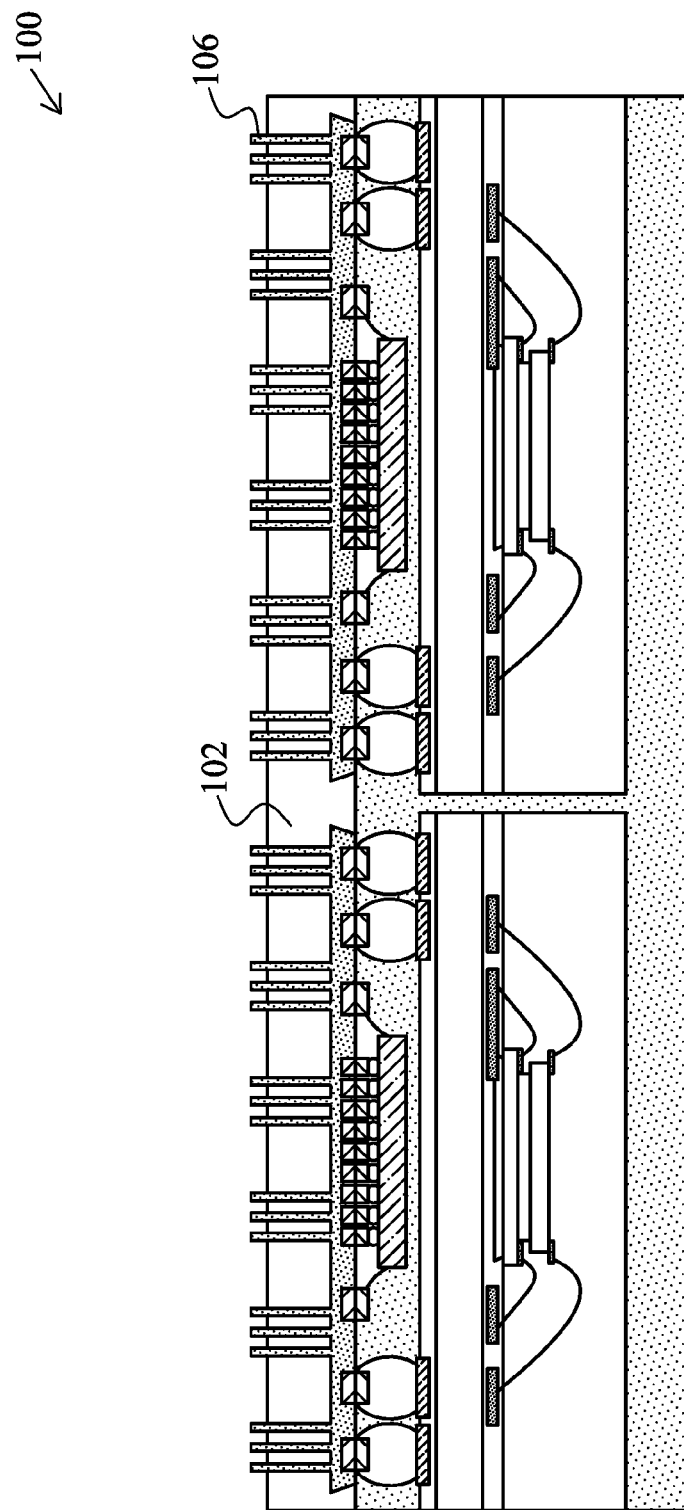
FIG. 10 illustrates a cross sectional view of the semiconductor device shown in FIG. 9 after a backside grinding process is applied to the backside of the bottom package in accordance with various embodiments of the present disclosure.

FIG. 10 illustrates a cross sectional view of the semiconductor device shown in FIG. 9 after a backside grinding process is applied to the backside of the bottom package in accordance with various embodiments of the present disclosure. The backside of the wafer 102 undergoes a grinding process. The grinding process can employ a mechanical grinding process, a chemical polishing process, an etching process or the like. By employing the thinning process, the backside of the wafer 102 can be ground so that the wafer 102 may have a thickness of approximately sub-100 um. In accordance with an embodiment, the thickness of the wafer 102 may be reduced to a range from about 20 um to about 50 um.

As shown in FIG. 10, the grinding process is applied to the backside of the bottom package 102 until the embedded ends of the TSVs (e.g., TSV 106) become exposed. In particular, as shown in FIG. 10, the terminals of the through vias may be protruding over the surface of the backside of the bottom package 102.

It should be noted that by grinding the wafer 102 to a thickness as low as 20 um, such a thin wafer may enable small via feature size such as via diameter and depth. An advantageous feature of forming small TSVs is that the performance and power consumption of package-to-package semiconductor device 100 can be further improved.

Figure 11:
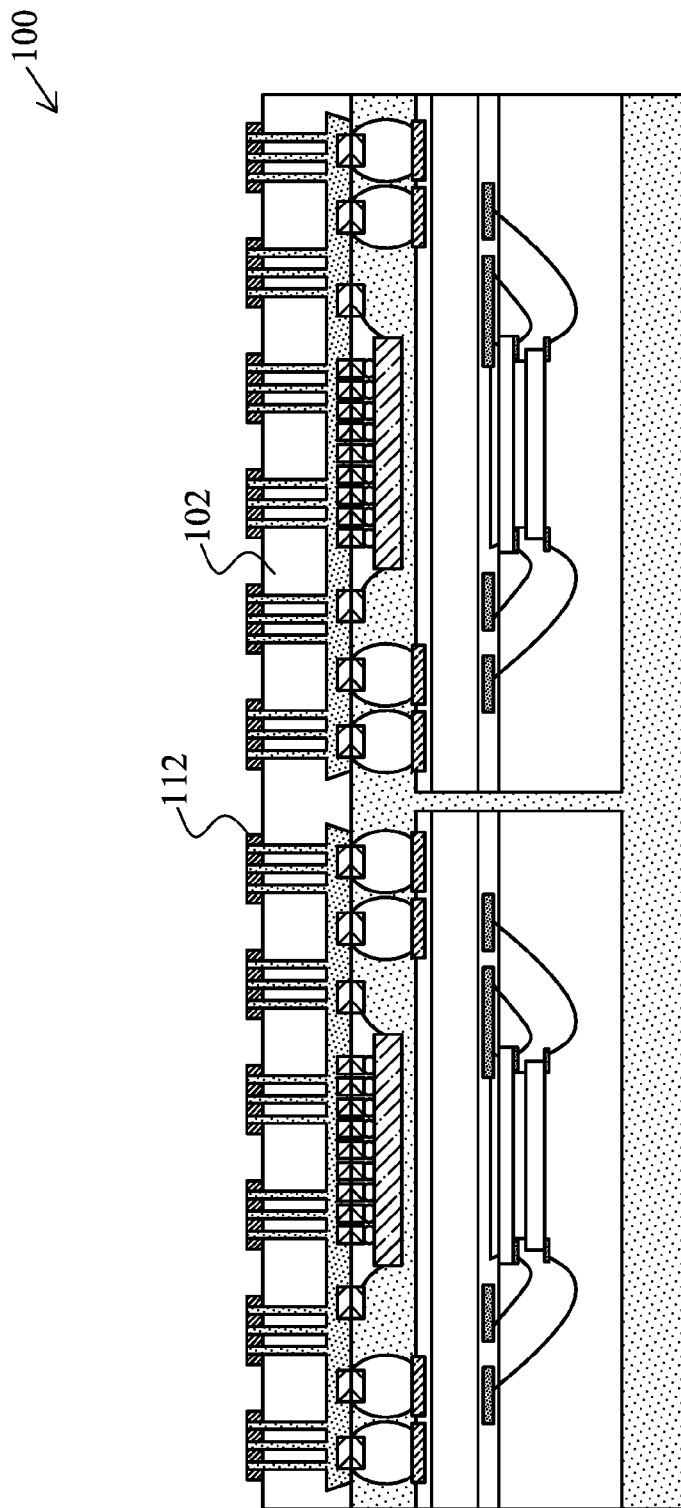
FIG. 11 illustrates a cross sectional view of the semiconductor device shown in FIG. 10 after a redistribution layer is formed on the backside of the bottom package in accordance with various embodiments of the present disclosure.

FIG. 11 illustrates a cross sectional view of the semiconductor device shown in FIG. 10 after a redistribution layer is formed on the backside of the bottom package in accordance with various embodiments of the present disclosure. A second redistribution layer 112 may be formed on a second side of the bottom package 102. The material and the formation method of the second redistribution layer 112 may be similar to that of the first redistribution layer 110 described above. Therefore, explicit description of the formation of the second redistribution layer 112 is omitted to avoid unnecessary repetition.

Figure 12:
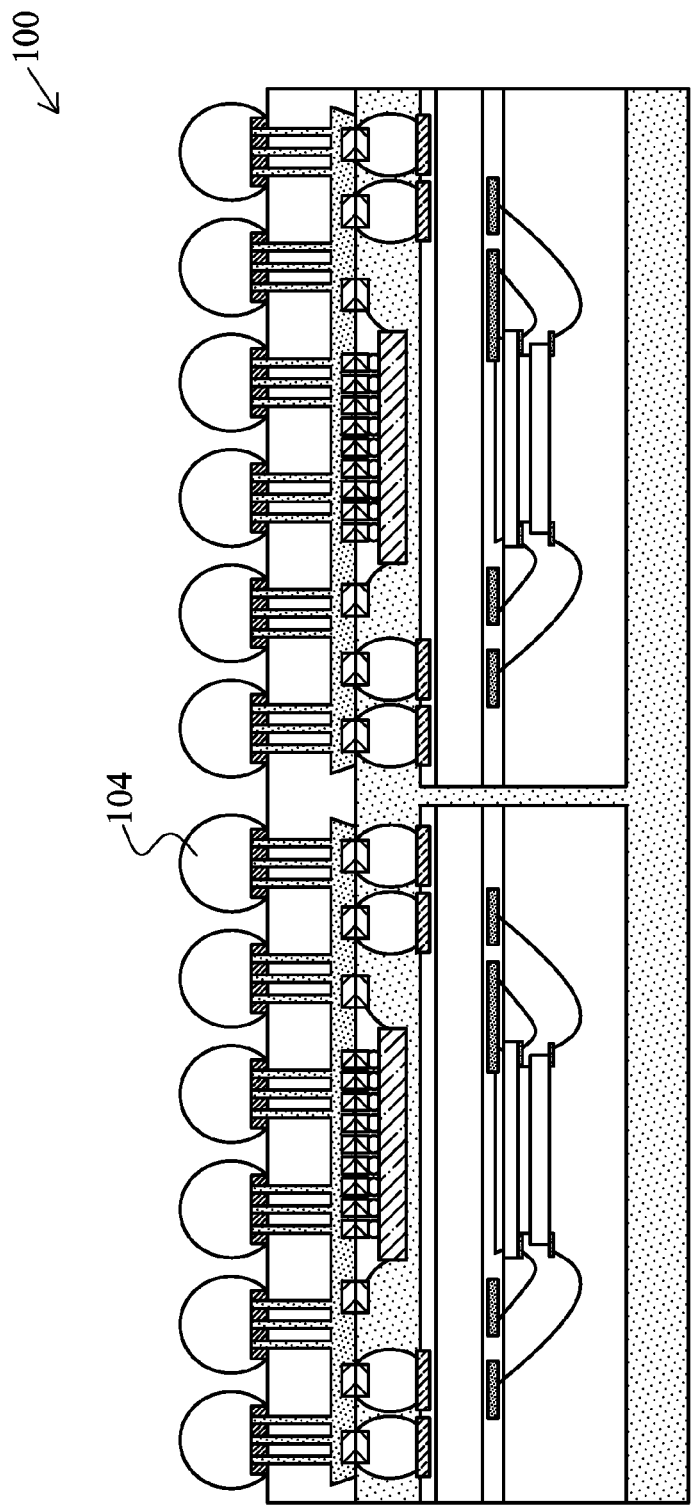
FIG. 12 illustrates a cross sectional view of the semiconductor device shown in FIG. 11 after a plurality of UBM structures and interconnection pads are formed in accordance with various embodiments of the present disclosure.

FIG. 12 illustrates a cross sectional view of the semiconductor device shown in FIG. 11 after a plurality of UBM structures and interconnection pads are formed in accordance with various embodiments of the present disclosure. The plurality of UBM structures (not shown) are formed over the second redistribution layer 112. The UBM structures help to prevent diffusion between the metal balls (e.g., metal balls 104) and the integrated circuits of the semiconductor device, while providing a low resistance electrical connection.

The interconnection pads 104 are input/output (I/O) pads or bumps of the semiconductor device. In accordance with an embodiment, the interconnection pads may be a plurality of metal balls 104. The metal balls 104 may be formed of copper, solder, any combinations thereof and the like. In some embodiments, the metal balls 104 may comprise SAC405. SAC405 comprises 95.5% Sn, 4.0% Ag and 0.5% Cu. Alternatively, the interconnection pads may be a plurality of land grid array (LGA) pads.

Figure 13:
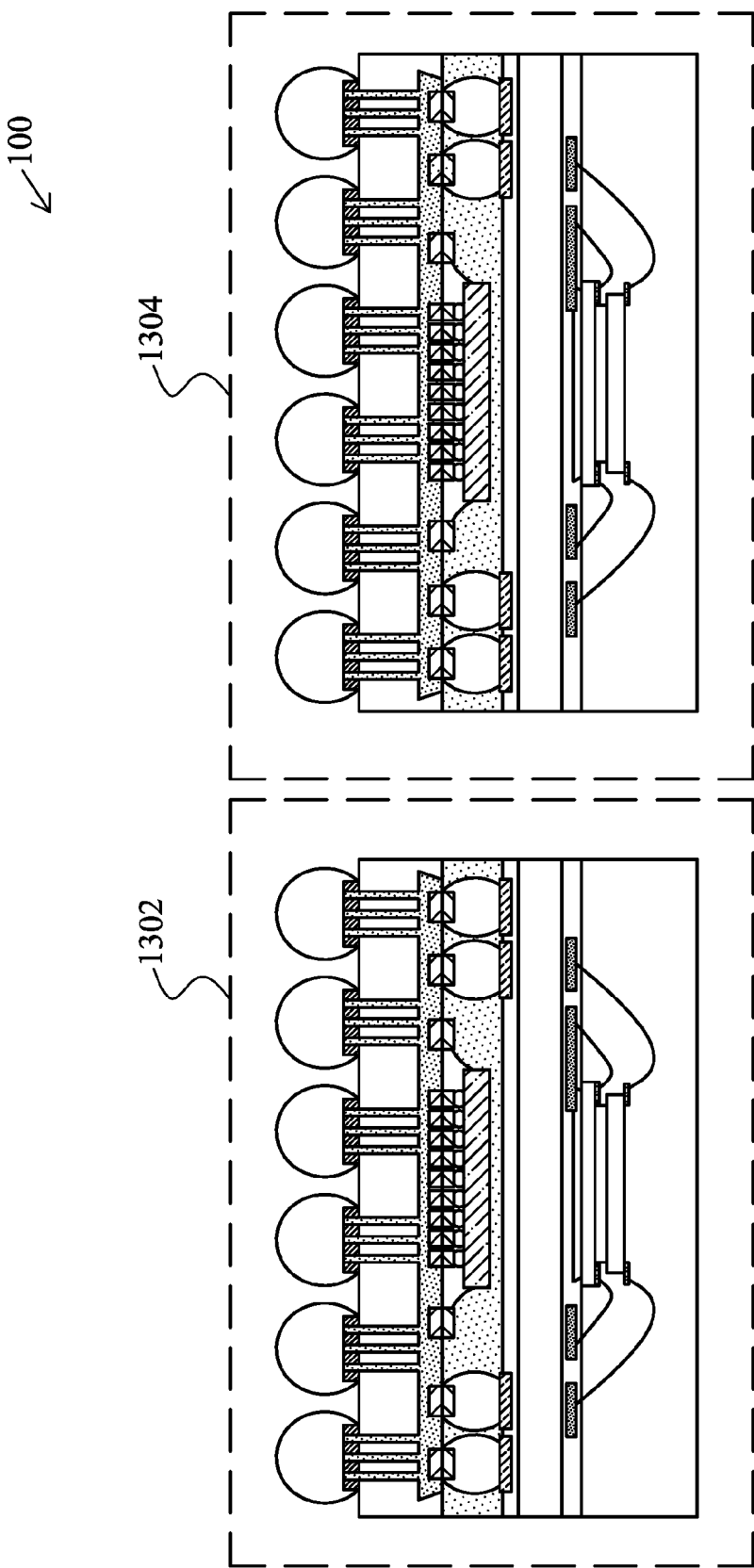
FIG. 13 illustrates a cross sectional view of the semiconductor device shown in FIG. 12 after a dicing process is applied to the semiconductor device in accordance with various embodiments of the present disclosure.

FIG. 13 illustrates a cross sectional view of the semiconductor device shown in FIG. 12 after a dicing process is applied to the semiconductor device in accordance with various embodiments of the present disclosure. A suitable dicing process may be employed to separate the semiconductor device 100 into individual chip packages. The dicing process is well known in the art, and hence is not discussed in detail herein.

FIGS. 14-24 illustrate intermediate steps of fabricating the package-on-package semiconductor device shown in FIG. 2 in accordance with various embodiments of the present disclosure. It should be noted that the fabrication steps as well as the package-on-package structure shown in FIGS. 14-24 are merely an example. A person skilled in the art will recognize there may be many alternatives, variations and modifications.

Figure 14:
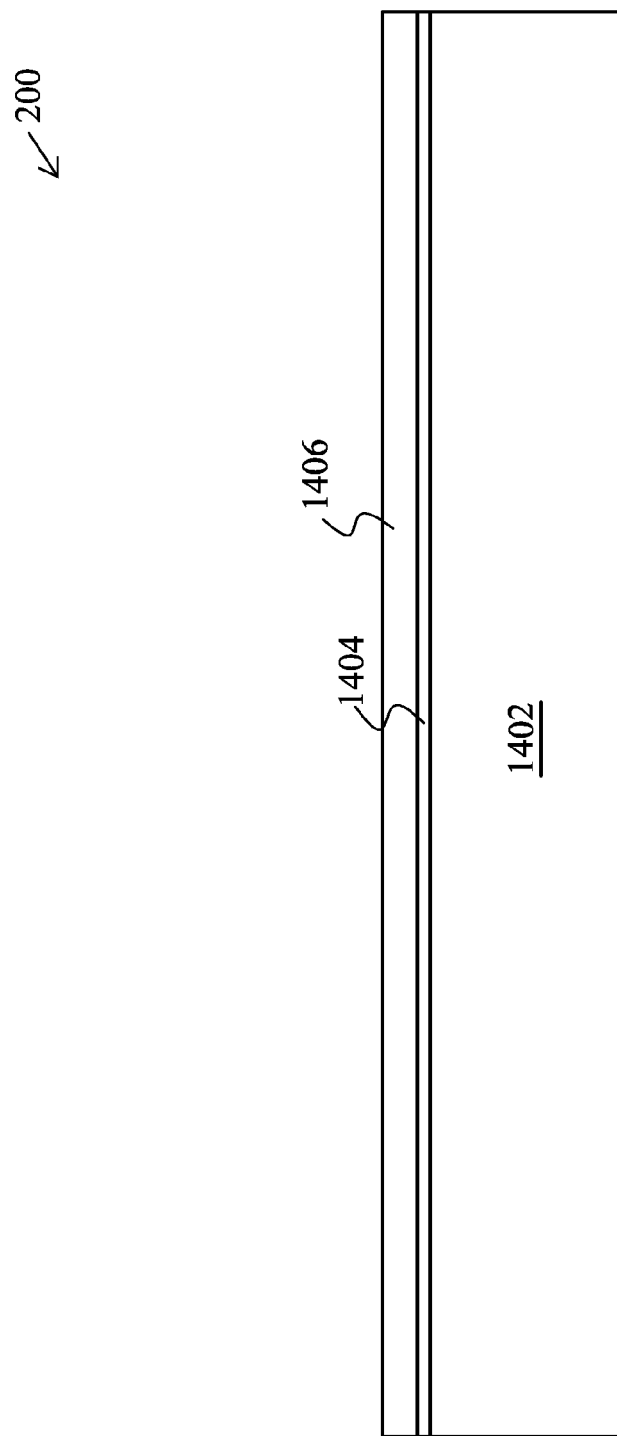
FIG. 14 illustrates a cross sectional view of a carrier in accordance with various embodiments of the present disclosure.

FIG. 14 illustrates a cross sectional view of a carrier in accordance with various embodiments of the present disclosure. A carrier 1402 may be employed to prevent the thin wafer (e.g., semiconductor die 202 shown in FIG. 2) from cracking, warping, breaking and the like. A release layer 1404 is formed on top of the carrier 1402. The release layer 1404 may be formed of suitable materials such as polymer and/or the like. The release layer 1404 may be UV-curable. In some embodiments, the release layer 1402 is spin-coated on the carrier 1402.

A sacrificial layer 1406 is spin-coated on the release layer 1404. The sacrificial layer 1406 may be formed of suitable materials such as polymer and/or the like. The sacrificial layer 1406 may be removed by using chemical solvent, CMP and/or the like.

Figure 15:
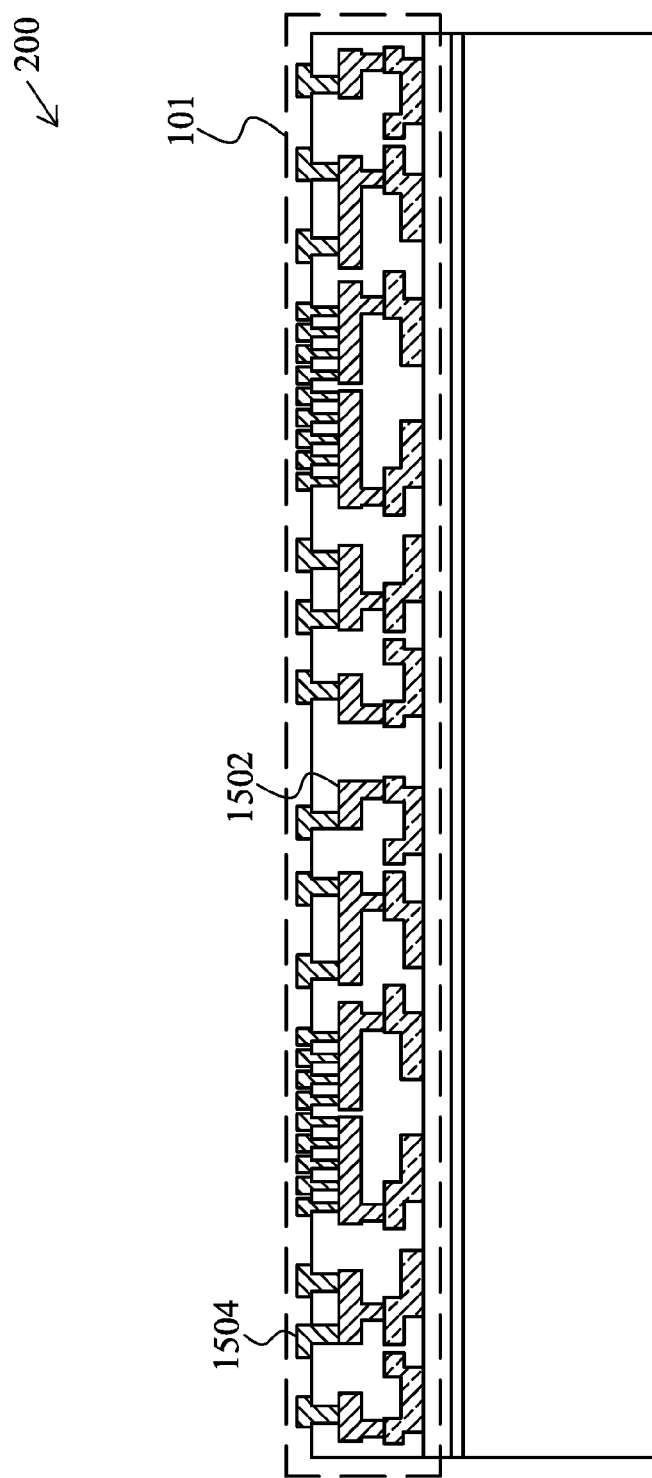
FIG. 15 illustrates a cross sectional view of the semiconductor device shown in FIG. 14 after a plurality of interconnect structures are formed over the sacrificial layer in accordance with various embodiments of the present disclosure.
Figure 16:
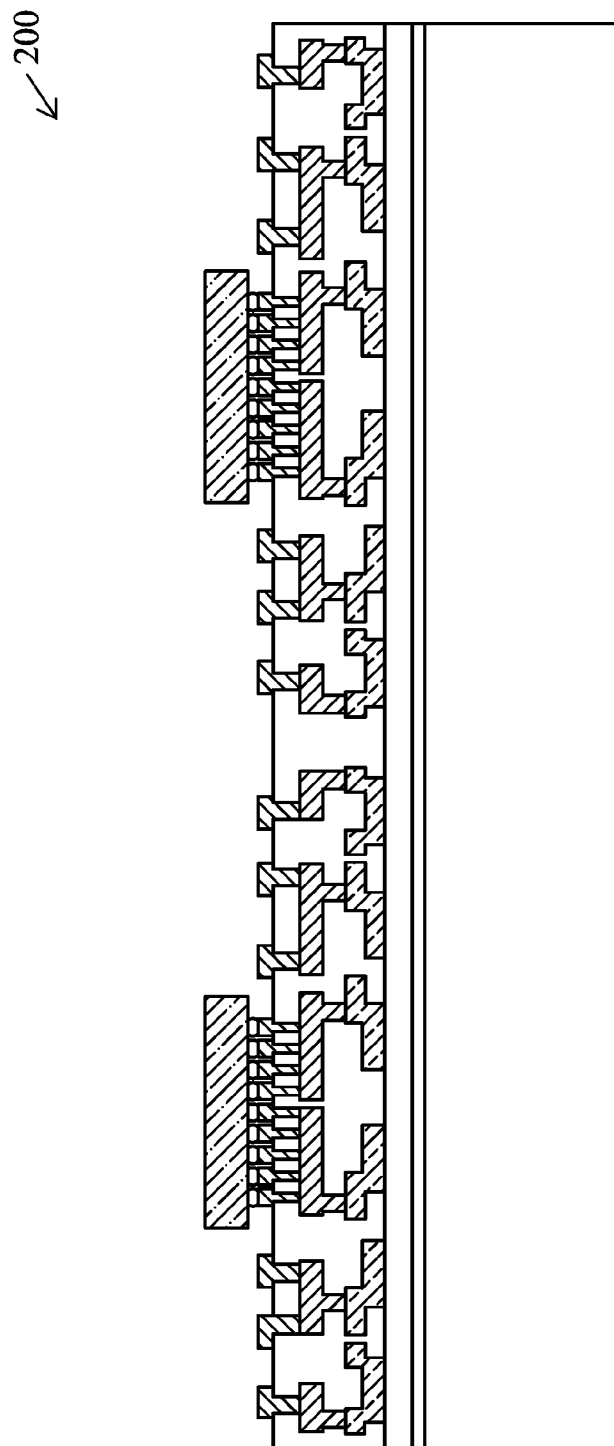
FIGS. 16-20 illustrate various fabrication steps such as mounting a logic chip on the bottom package, forming an underfill layer between the logic chip and the bottom package, mounting a top package on the bottom package, forming an encapsulation layer over the bottom package and polishing the encapsulation layer.
Figure 17:
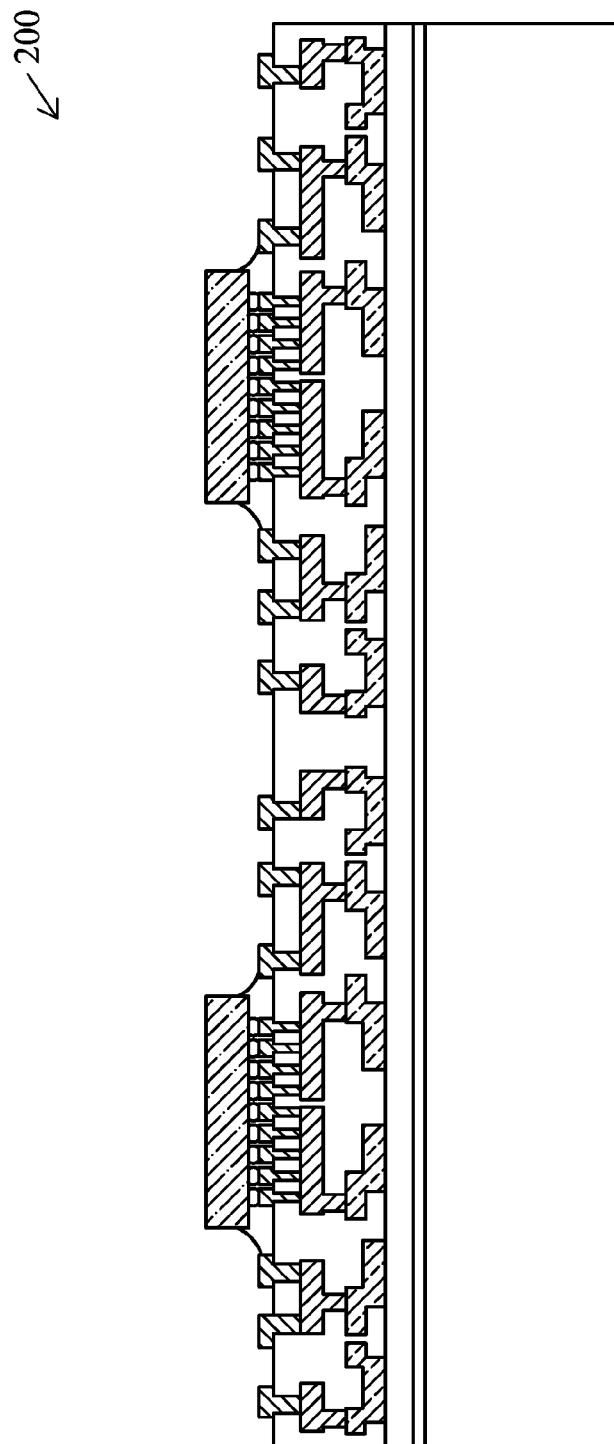
Figure 18:
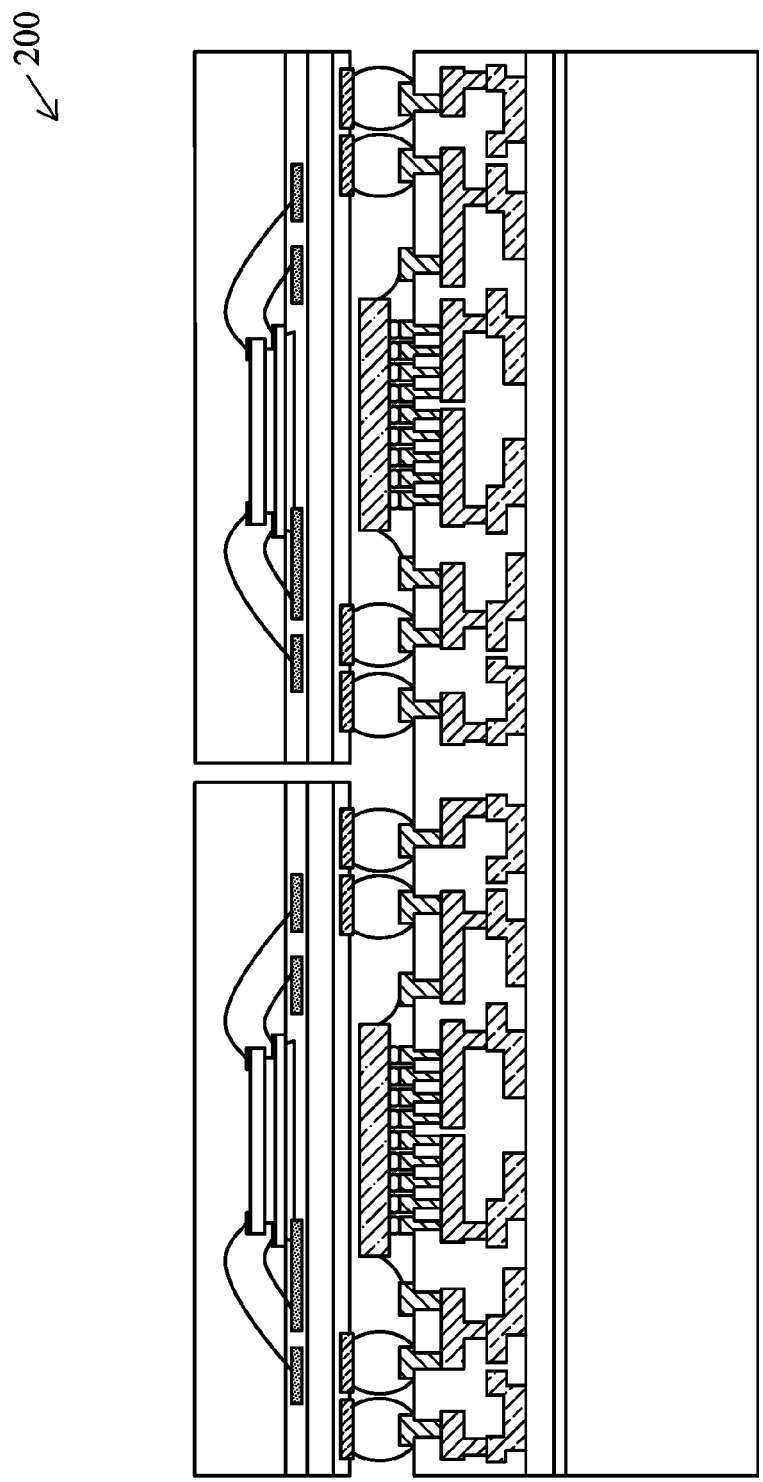
Figure 19:
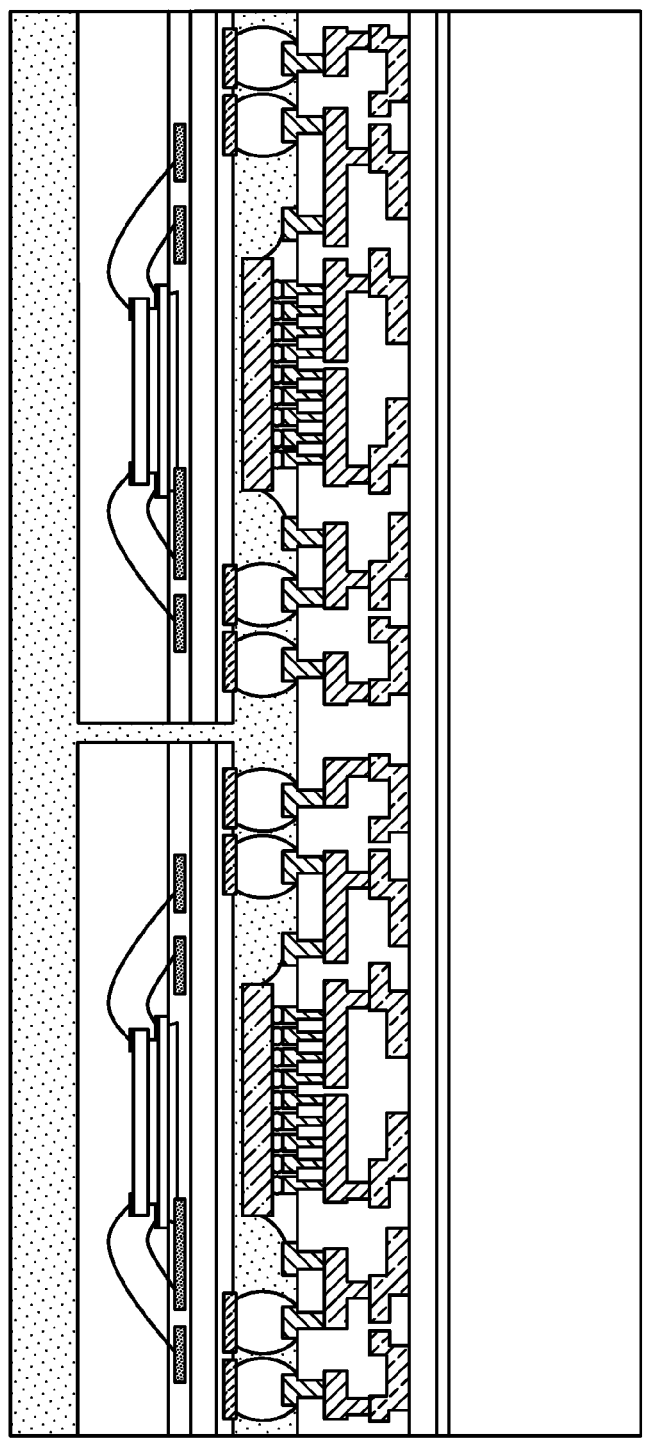
Figure 20:
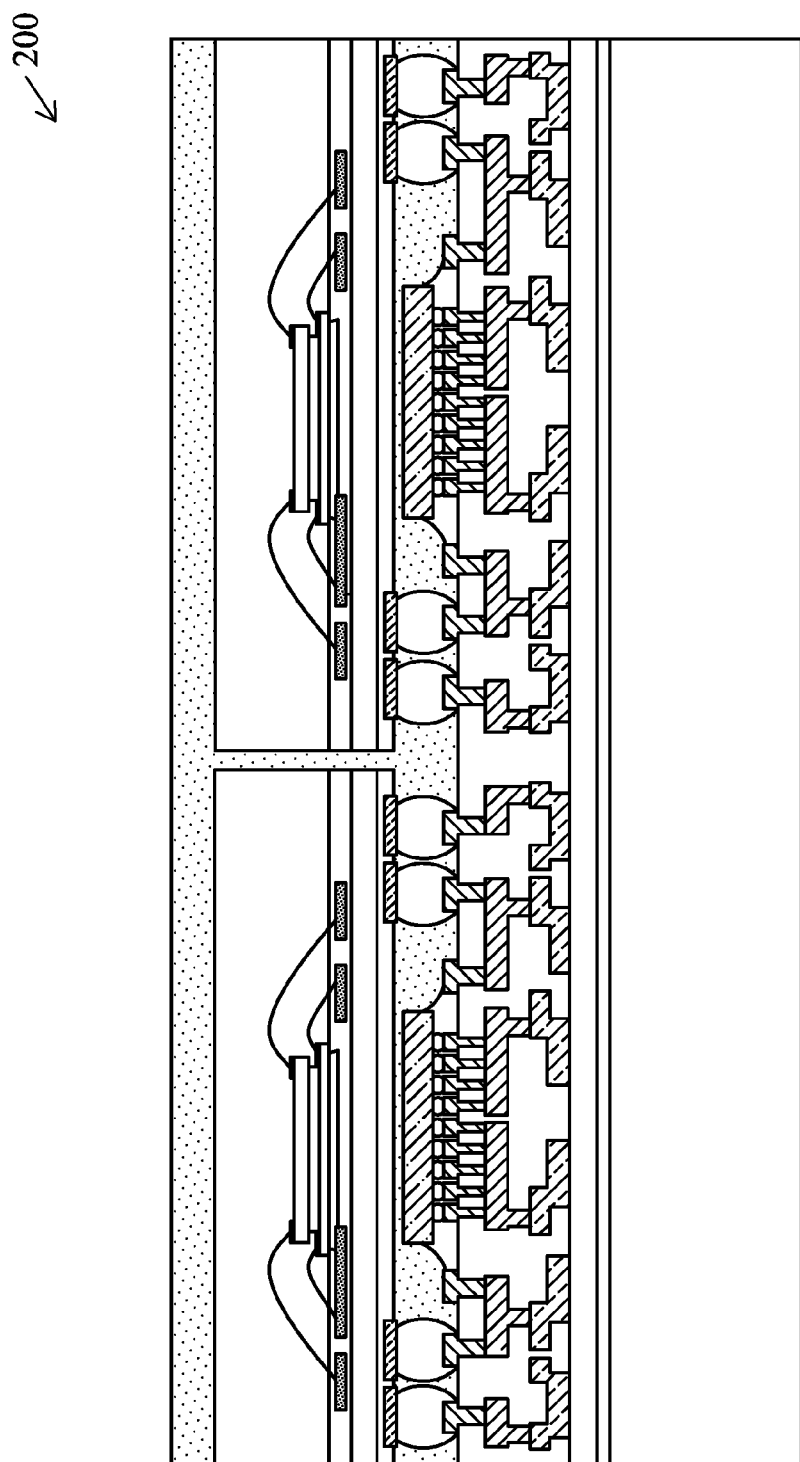

FIG. 15 illustrates a cross sectional view of the semiconductor device shown in FIG. 14 after a plurality of interconnect structures are formed over the sacrificial layer in accordance with various embodiments of the present disclosure. As shown in FIG. 15, the bottom package 101 includes a plurality of interconnect structure.

The interconnect structures may include an ILD layer, an IMD layer, a metal line and a redistribution layer. This interconnect structure shown in FIG. 15 is merely an example, which should not unduly limit the scope of the claims. One of ordinary skill in the art would recognize many variations, alternatives, and modifications. For example, the interconnect structure may comprise a plurality of IMD layers.

Throughout the description, the dielectric layer in which contact plugs are formed may be referred to as an ILD layer, and the dielectric layers over the ILD are referred to as IMD layers. The metal lines are formed in the IMD layers. The redistribution layer may be formed over the IMD layers.

The ILD layer may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof or the like, by any suitable method known in the art, such as spinning, CVD, and PECVD.

One or more IMD layers and the associated metallization layers (not shown) are formed over the ILD layer. Generally, the one or more IMD layers and the associated metal lines are used to interconnect the electrical circuitry to each other and to provide an external electrical connection. The IMD layers are preferably formed of a low-K dielectric material, such as fluorosilicate glass (FSG) formed by PECVD techniques or high-density plasma chemical vapor deposition (HDPCVD) or the like It should be noted the interconnect structure may comprise a plurality of metal lines 1502 as shown in FIG. 15. The metal lines 1502 are used to interconnect the integrated circuit devices. The metal lines 1502 may be formed in different layers and separated by the ILD layers and the IMD layers.

One skilled in the art will recognize that the interconnect structure may comprise more inter-metal dielectric layers and the associated metal lines and plugs. In particular, the layers between the metallization layers may be formed by alternating layers of dielectric (e.g., extremely low-k dielectric material) and conductive materials (e.g., copper).

The metal lines 1502 may be formed of metal materials such as copper, copper alloys, aluminum, silver, gold, any combinations thereof and/or the like. The metal lines 1502 may be formed by a dual damascene process, although other suitable techniques such as deposition, single damascene may alternatively be used. The dual damascene process is well known in the art, and hence is not discussed herein The redistribution layer 1504 may be a single material layer, or a multi-layered structure and may be made of metals such as titanium, titanium nitride, aluminum, tantalum, copper and combinations thereof. The redistribution layer 1504 may be made by any suitable method known in the art such as PVD, sputter, CVD, electroplating and/or the like.

FIGS. 16-20 illustrate various fabrication steps such as mounting a logic chip on the bottom package, forming an underfill layer between the logic chip and the bottom package, mounting a top package on the bottom package, forming an encapsulation layer over the bottom package and polishing the encapsulation layer. These fabrication steps are similar to those shown in FIGS. 5-9, and hence are not discussed herein to avoid repetition.

Figure 21:
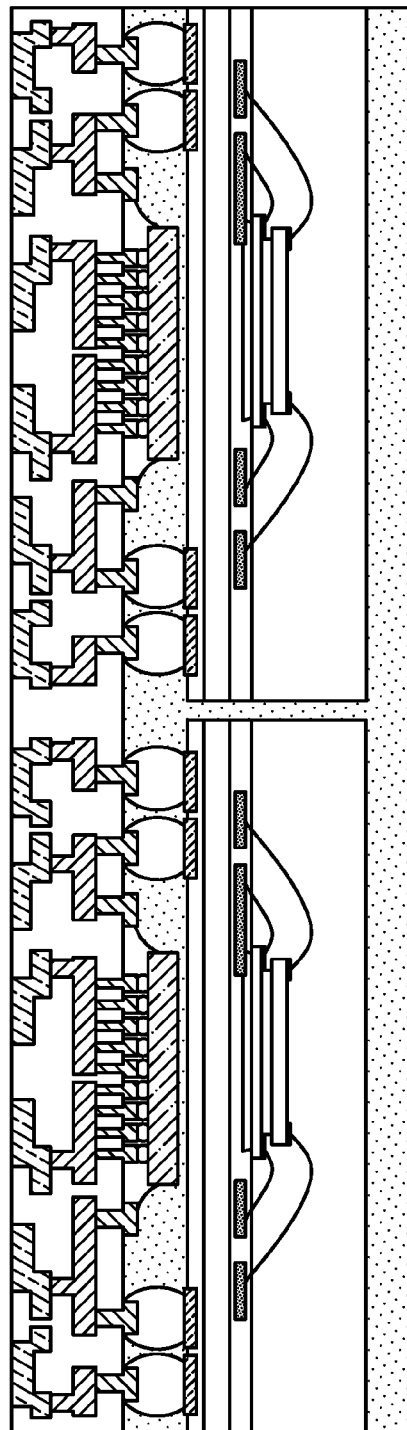
FIG. 21 illustrates a process of removing the carrier from package-to-package semiconductor device in accordance with various embodiments of the present disclosure.

FIG. 21 illustrates a process of removing the carrier from package-to-package semiconductor device in accordance with various embodiments of the present disclosure. In accordance with an embodiment, the carrier 1402 can be detached from the package-on-package semiconductor device 200. A variety of detaching processes may be employed to separate the package-on-package semiconductor device 200 from the carrier 1402. The variety of detaching processes may comprise a chemical solvent, a UV exposure, a laser ablation process and/or the like.

Figure 22:
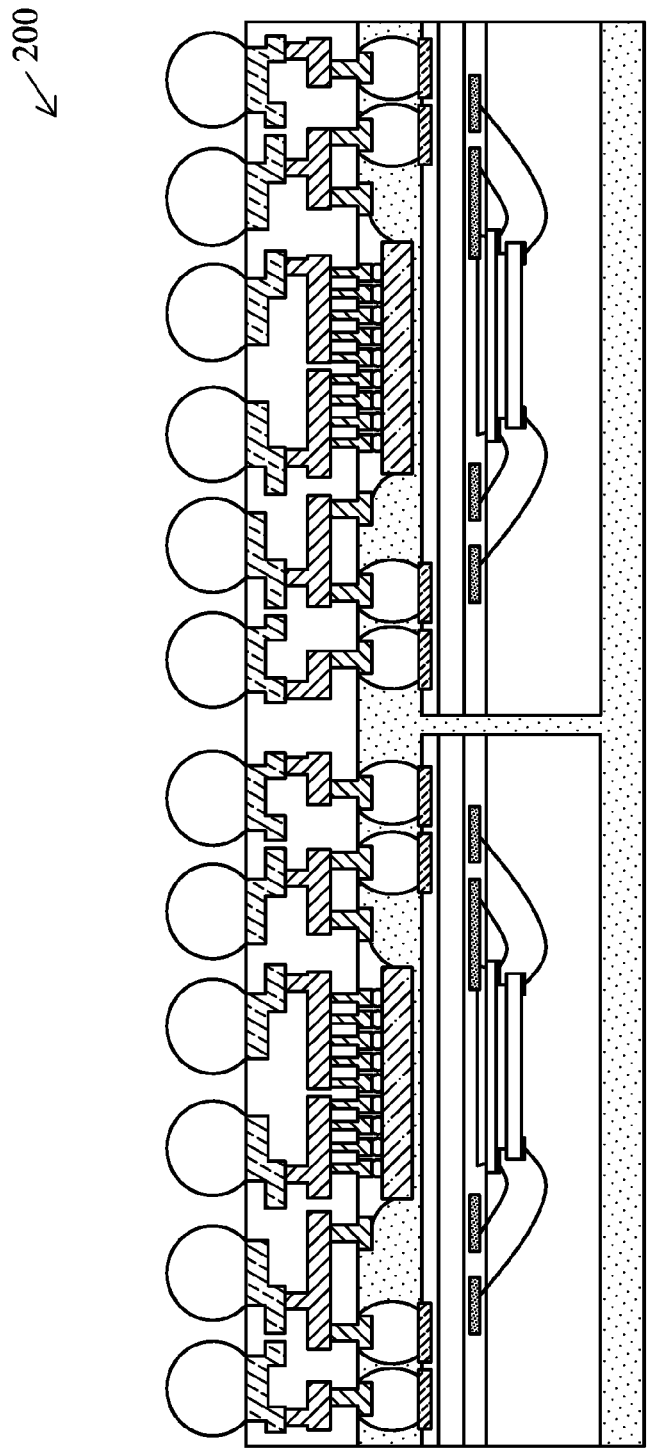
FIGS. 22-24 illustrate mounting conductive bumps on the bottom package, grinding the backside of the top packages and sawing the semiconductor device into individual chip packages in accordance with various embodiments of the present disclosure.
Figure 23:
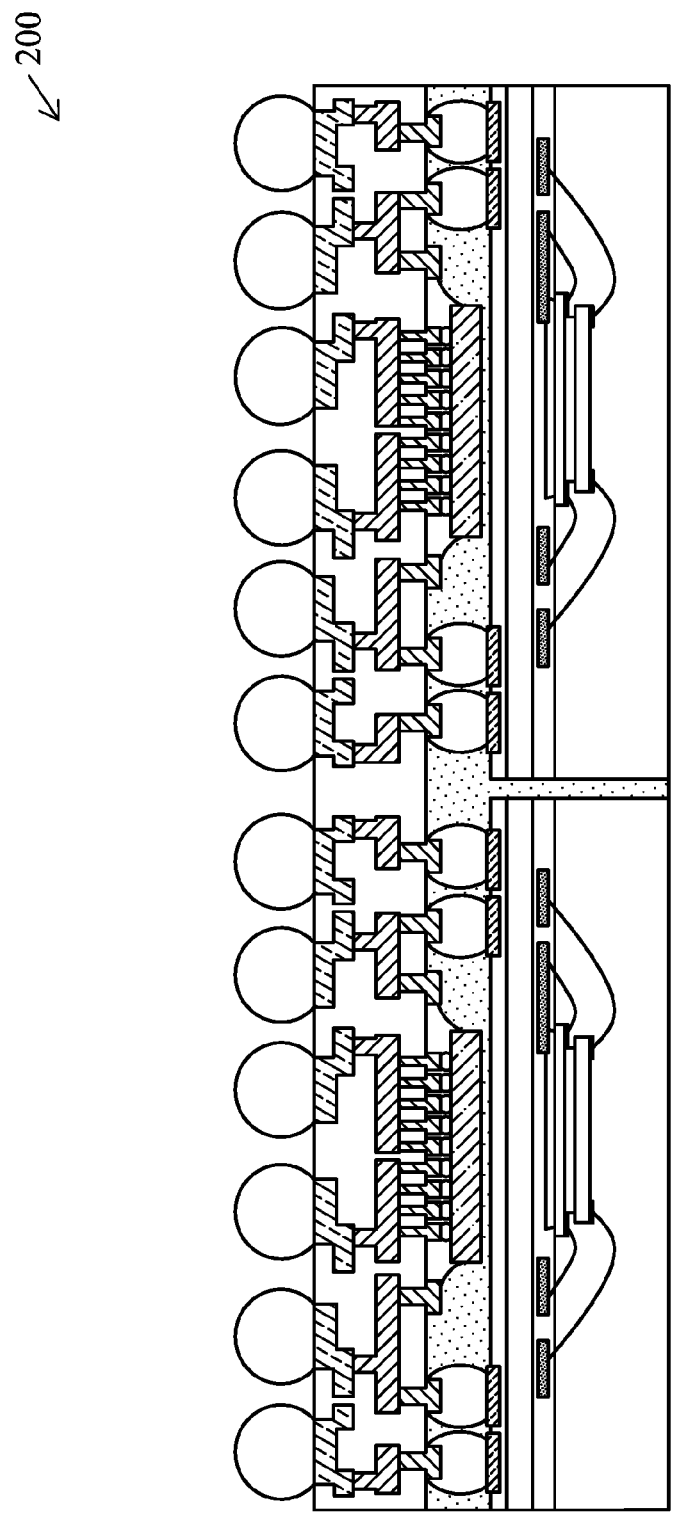
Figure 24:
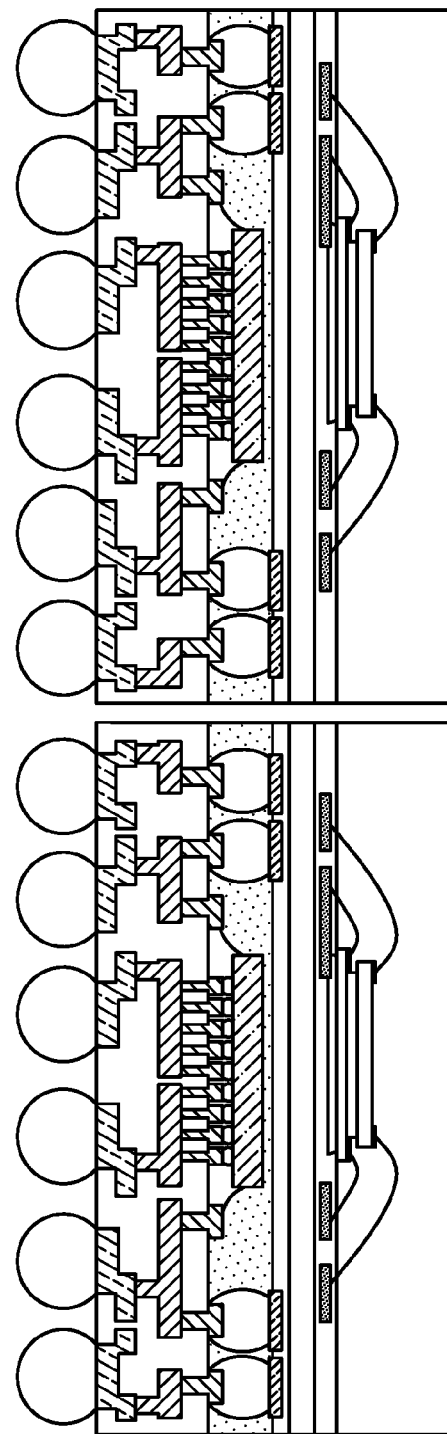

FIGS. 22-24 illustrate mounting conductive bumps on the bottom package, grinding the backside of the top packages and sawing the semiconductor device into individual chip packages in accordance with various embodiments of the present disclosure. These fabrication steps are similar to those shown in FIGS. 12 and 13, and hence are not discussed herein to avoid repetition.

In accordance with an embodiment, a method comprises forming a plurality of interconnect structures including a dielectric layer, a metal line and a redistribution line over a carrier, attaching a semiconductor die on a first side of the plurality of interconnect structures, forming an underfill layer between the semiconductor die and the plurality of interconnect structures, mounting a top package on the first side the plurality of interconnect structures, wherein the top package comprises a plurality of conductive bumps, forming an encapsulation layer over the first side of the plurality of interconnect structures, wherein the top package is embedded in the encapsulation layer, detaching the carrier from the plurality of interconnect structures and mounting a plurality of bumps on a second side of the plurality of interconnect structures.

In accordance with another embodiment, a method comprises forming a plurality of interconnect structures over a carrier, attaching a first semiconductor die and a second semiconductor die on a first side of the plurality of interconnect structures, forming a first underfill layer between the first semiconductor die and the plurality of interconnect structures and a second underfill layer between the second semiconductor die and the plurality of interconnect structures, mounting a first top package over the first semiconductor die and a second top package over the second semiconductor die to form a package-on-package device, forming an encapsulation layer over the first side of the plurality of interconnect structures, mounting a plurality of bumps on a second side of the plurality of interconnect structures and sawing the package-on-package device to form a first chip comprising the first top package and a second chip comprising the second top package.

In accordance with yet another embodiment, a method comprises forming a bottom package including a plurality of interconnect structures on a carrier, attaching a first semiconductor die and a second semiconductor die on a first side of the bottom package, mounting a first top package and a second top package over the bottom package, wherein the first semiconductor die is between two bumps of the first top package and the second semiconductor die is between two bumps of the second top package, forming an encapsulation layer over the first top package and the second top package, detaching the carrier from the plurality of interconnect structures and mounting a plurality of bumps on a second side of the bottom package.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    forming a plurality of interconnect structures including a dielectric layer, a metal line, a first redistribution line, a second redistribution line, and a third redistribution line over a carrier;
    after forming the plurality of interconnect structures, attaching a semiconductor die on a first side of the plurality of interconnect structures;
    after attaching the semiconductor die, mounting a top package on the first side of the plurality of interconnect structures, wherein the top package comprises a plurality of conductive bumps;
    after mounting the top package, forming an encapsulation layer over the first side of the plurality of interconnect structures, wherein an upper surface and opposing sidewalls of the top package are completely covered by the encapsulation layer;
    thinning the encapsulation layer, wherein, after thinning, the upper surface of the top package remains covered; and
    after forming the encapsulation layer, detaching the carrier from the plurality of interconnect structures.

2. The method of claim 1 further comprising, prior to mounting the top package, forming an underfill layer between the semiconductor die and the plurality of interconnect structures, wherein the underfill layer extends from the first redistribution line of the plurality of interconnect structures to the second redistribution line of the plurality of interconnect structures.

3. The method of claim 1, wherein three sides of the third redistribution line is fully covered by a first conductive bump of the plurality of conductive bumps.

4. The method of claim 1 further comprising, after detaching the carrier, mounting a plurality of bumps on a second side of the plurality of interconnect structures.

5. The method of claim 1, wherein the top package completely covers the semiconductor die.

6. The method of claim 1, wherein the encapsulation layer extends between the semiconductor die and the top package.

7. The method of claim 1, wherein the encapsulation layer directly contacts the first redistribution line.

8. A method comprising:
    forming a plurality of interconnect structures over a carrier, wherein the plurality of interconnect structures comprises a dielectric layer and a redistribution line over the dielectric layer;
    after forming the plurality of interconnect structures, attaching a first semiconductor die and a second semiconductor die on a first side of the plurality of interconnect structures;
    after attaching the first semiconductor die and the second semiconductor die, forming a first underfill layer between the first semiconductor die and the plurality of interconnect structures, and a second underfill layer between the second semiconductor die and the plurality of interconnect structures;
    mounting a first top package over the first semiconductor die and a second top package over the second semiconductor die to form a package-on-package device;
    forming an encapsulation layer over the first side of the plurality of interconnect structures, wherein the encapsulation layer directly contacts the first underfill layer;
    mounting a plurality of first bumps on a second side of the plurality of interconnect structures; and
    sawing the package-on-package device to form a first chip comprising the first top package and a second chip comprising the second top package.

9. The method of claim 8, wherein the first underfill layer extends from a sidewall of the redistribution line to a sidewall of the first semiconductor die.

10. The method of claim 9, wherein the encapsulation layer directly contacts the redistribution line.

11. The method of claim 8, wherein the encapsulation layer extends between the first semiconductor die and the first top package, wherein the encapsulation layer extends between the second semiconductor die and the second top package.

12. The method of claim 11, wherein the encapsulation layer extends between the first top package and the second top package.

13. The method of claim 8, wherein the first top package extends completely over the first semiconductor die.

14. The method of claim 8, wherein after sawing sidewalls of the first top package are free of the encapsulation layer.

15. A method comprising:
    forming a bottom package including a plurality of interconnect structures on a carrier, wherein the plurality of interconnect structures comprises a metal line and a via;
    after forming the bottom package, attaching a first semiconductor die and a second semiconductor die on a first side of the bottom package;
    mounting a first top package and a second top package over the bottom package, wherein each of the first top package and the second top package comprises a first substrate, a die on the first substrate, and a first encapsulant over the first substrate and the die, wherein the first semiconductor die is between two bumps of the first top package and the second semiconductor die is between two bumps of the second top package, wherein mounting the first top package comprises forming a solder connection on a conductive element of the bottom package, the solder connection contacting a top surface and opposing sidewalls of the conductive element;
    forming an encapsulation layer over the first top package and the second top package, wherein the encapsulation layer extends completely over the first top package and the second top package, wherein the encapsulation layer completely separates the first top package from the second top package, and wherein the encapsulation layer extends between the bottom package and the first top package and between the bottom package and the second top package; and
    after forming the encapsulation layer, detaching the carrier from the plurality of interconnect structures.

16. The method of claim 15 further comprising, prior to mounting the first top package, forming a first underfill layer between the first semiconductor die and the bottom package, and forming a second underfill layer between the second semiconductor die and the bottom package, wherein the first underfill layer extends along sidewalls of a first redistribution line and a second redistribution line of the bottom package.

17. The method of claim 16, wherein the encapsulation layer directly contacts the first underfill layer and the second underfill layer.

18. The method of claim 16, wherein the first underfill layer contacts a sidewall of the first semiconductor die.

19. The method of claim 15 further comprising singulating the bottom package into a first bottom package and a second bottom package, wherein after singulating a sidewall of the first top package is vertically aligned with a sidewall of the encapsulation layer positioned between the first top package and the first bottom package.

20. The method of claim 19, further comprising prior to singulating, attaching mounting a plurality of bumps on a bottom surface of the bottom package.

\* \* \* \* \*